(12) United States Patent
Adamski

(10) Patent No.: US 9,184,709 B2
(45) Date of Patent: Nov. 10, 2015

(54) RESONANT PRE-DRIVER FOR SWITCHING AMPLIFIER

(71) Applicant: Peregrine Semiconductor Corporation, San Diego, CA (US)

(72) Inventor: Jaroslaw Adamski, Streamwood, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 161 days.

(21) Appl. No.: 14/049,178

(22) Filed: Oct. 8, 2013

(65) Prior Publication Data

US 2015/0097620 A1   Apr. 9, 2015

(51) Int. Cl.
    *H03F 3/217*   (2006.01)
(52) U.S. Cl.
    CPC .................................. *H03F 3/2176* (2013.01)
(58) Field of Classification Search
    USPC ...................................... 330/251, 207 A, 302
    IPC ........................................................ H03F 3/217
    See application file for complete search history.

(56) References Cited

U.S. PATENT DOCUMENTS

| | | | |
|---|---|---|---|
| 3,539,826 A * | 11/1970 | Crouse | 327/363 |
| 6,636,112 B1 * | 10/2003 | McCune | 330/10 |
| 7,248,120 B2 | 7/2007 | Burgener et al. | |
| 2008/0116974 A1 * | 5/2008 | McMorrow | 330/251 |
| 2009/0128237 A1 * | 5/2009 | Attwood et al. | 330/251 |
| 2012/0319782 A1 * | 12/2012 | Nam et al. | 330/310 |
| 2013/0222075 A1 | 8/2013 | Reedy et al. | |
| 2013/0307616 A1 * | 11/2013 | Berchtold et al. | 330/127 |

FOREIGN PATENT DOCUMENTS

WO   2009108391   9/2009

OTHER PUBLICATIONS

Harden, Paul, "The Handiman's Guide to MOSFET "Switched Mode" Amplifiers", Part 1, 2003, publicly available at www.nrao.edu, 6 pgs.

* cited by examiner

*Primary Examiner* — Patricia T Nguyen
(74) *Attorney, Agent, or Firm* — Jaquez Land Richman LLP; Martin J. Jaquez, Esq.; Alessandro Steinfl, Esq.

(57) ABSTRACT

An arrangement and a method for improving the efficiency of a multistage switching amplifier using a resonant circuit element is presented. The multistage amplifier comprises a pre-driver amplifier, a final stage amplifier and a series L-C arrangement coupled between the pre-driver amplifier and the final stage amplifier. The series L-C arrangement forms a parallel L-C resonant circuit with a gate to source capacitor of an input transistor of the final stage amplifier. An oscillation of energy takes place between the gate to source capacitor of the input transistor of the final stage amplifier and the series L-C arrangement. This oscillation of energy provides the final stage amplifier with driving current and improves efficiency of the overall multistage amplifier arrangement.

54 Claims, 19 Drawing Sheets

Discharging Cycle

Discharging Cycle

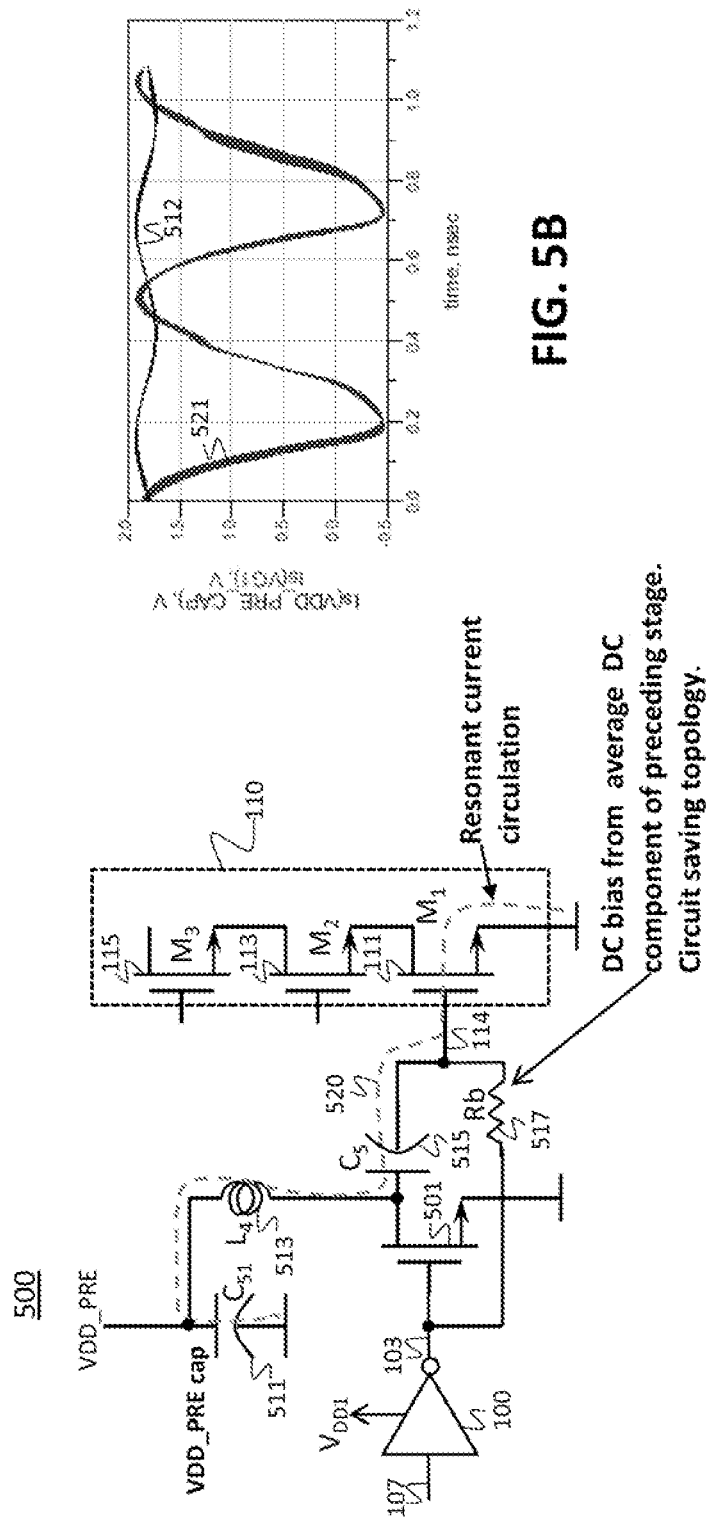

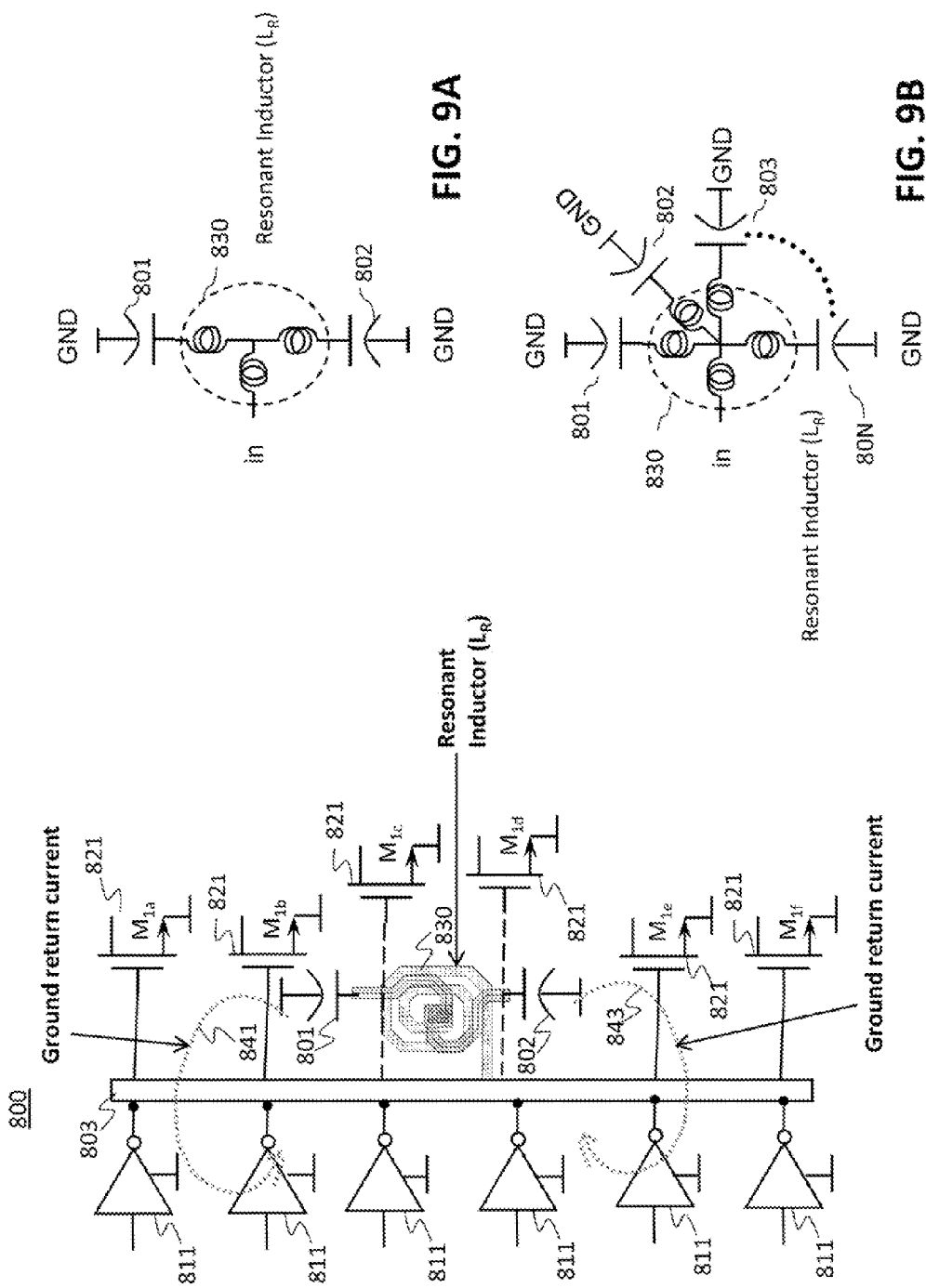

RESONANT PRE-DRIVER FOR SWITCHING AMPLIFIER

BACKGROUND

Field

The present application relates to power amplifiers. In particular, the present application relates to a resonant pre-driver for switching amplifier.

SUMMARY

The present disclosure describes implementation of amplifier circuits comprising at least a resonant circuit arrangement coupled between a first pre-driver amplifier and a second power amplifier acting as a final driver. The power amplifiers may be assumed as to be switching amplifiers, for example, such as class E, F, D and or C amplifiers. Different types of waveforms such as sinusoidal signals, square waves or sawtooth waves may be input to the disclosed amplifier circuit and the signals may operate at a wide range of frequencies, such as those used for cellular phone systems. Hence, the amplification circuits described in the present disclosure may be used in applications such as cellular phones, but are not limited to such applications.

According to a first aspect, a switching amplifier is disclosed, where the switching amplifier comprises: a pre-driver amplifier having a pre-driver output; a final stage amplifier having a final stage amplifier input and a final stage amplifier output, where the final stage amplifier input is coupled to the pre-driver output, and where the final stage amplifier input has a final stage amplifier input capacitance, where the final stage amplifier is configured to have a charging cycle and a discharging cycle whereby the final stage amplifier input capacitance stores energy during the charging cycle and the final stage amplifier input capacitance discharges energy during the discharging cycle, and a resonant circuit element coupled to the final stage amplifier input, wherein the resonant circuit element is configured to receive energy from the final stage amplifier input capacitance during the discharging cycle and supply energy to the final stage amplifier input capacitance during the charging cycle. The switching amplifier may have an operating frequency and component values for the resonant circuit element may be chosen to provide a resonant frequency of the resonant circuit element and the final stage amplifier input capacitance close to the operating frequency.

According to a second aspect, a method for amplifying an input signal to an output signal with switching amplification is disclosed, where the method comprises: amplifying the input signal with a pre-driver amplification stage to provide a pre-driver output signal; coupling the pre-driver output signal to a final amplification stage input of a final amplification stage, wherein the final amplification stage input has a charging cycle and a discharging cycle and wherein the final amplification stage input has an final amplification input capacitance; discharging at least a portion of energy stored in the final amplification input capacitance into a resonant element during the discharging cycle; charging the final amplification input capacitance with at least a portion of energy stored in the resonant element during the charging cycle; and amplifying the final amplification stage input to the output signal with the final amplification stage.

According to a third aspect, a multistage amplifier arrangement is disclosed, where the multistage amplifier arrangement comprises: means for pre-driver amplification; means for final stage amplification, wherein an input of the means for final stage amplification is coupled to an output of the means for pre-driver amplification and wherein the input of the means for final stage amplification comprises a means for capacitive energy storage; and means for energy storage, wherein the means for energy storage is coupled to the output of the means for pre-driver amplification and is configured to receive energy from the means for capacitive energy storage.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure. Like reference numerals indicate corresponding parts in the various figures.

FIG. 5A shows an example embodiment of the multistage amplifier of FIG. 2 with a field effect transistor (FET) and a DC biasing resistor connected at the output terminal of the pre-driver.

FIG. 5B shows voltage waveforms at two points within the embodiment depicted in FIG. 5A.

FIG. 8 shows a plurality of two stage amplifier devices in parallel in which all of the pre-drivers share a resonant inductor circuit.

FIG. 9A shows a schematic representation of the resonant inductor ($L_R$) of the exemplary embodiment of FIG. 8 with two ground returns, each comprising a DC blocking capacitor.

FIG. 9B shows a schematic representation of the resonant inductor ($L_R$) of FIG. 9A, expanded with a plurality of ground returns, each comprising a DC blocking capacitor.

DETAILED DESCRIPTION

Figure 1:
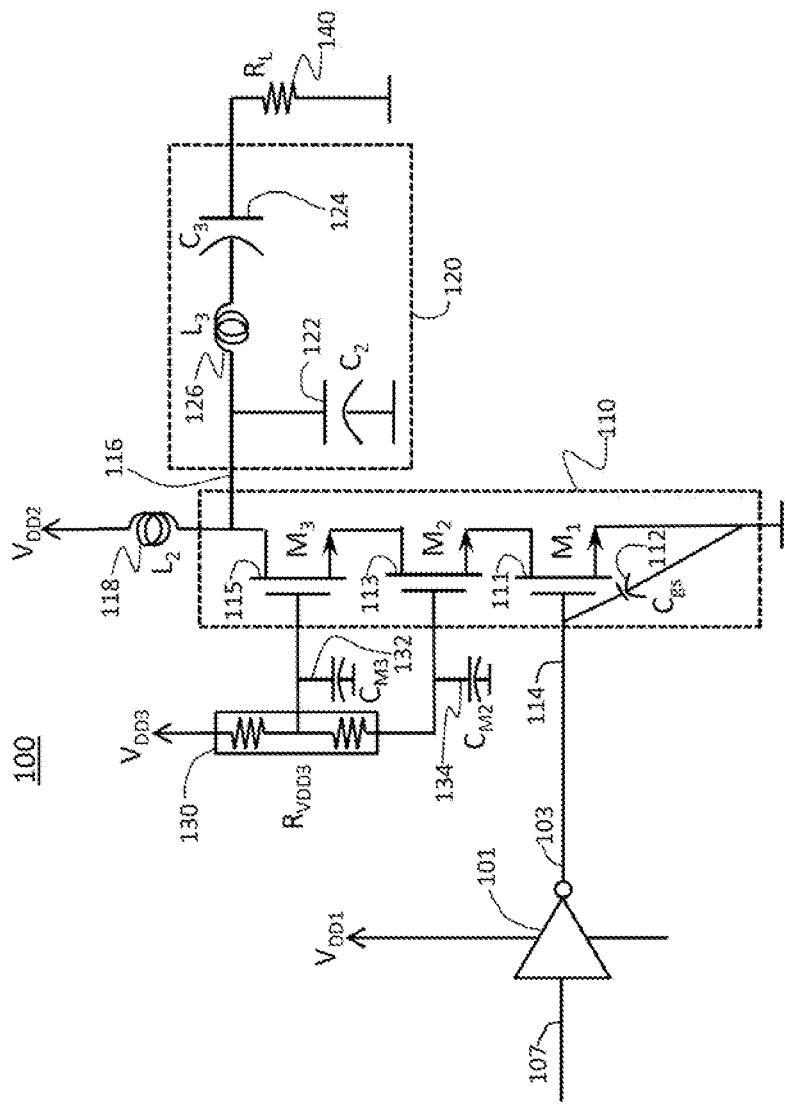
FIG. 1 shows a two stage amplifier device comprising a pre-driver and a class E final stage power amplifier (PA).

As known in the art, switching power amplifiers can be categorized in different classes and among them, class E, F, D and C are used frequently. Modern wireless cellular communication can place a high requirement on the efficiency of a radio frequency (RF) power amplifier used in a cellular handset. Due to the finite capacity of a battery, talk time, web surfing and data operations can be affected by the efficiency of the RF power amplifier.

Cellular systems, which can be implemented with constant envelope amplifiers (e.g. used in systems with constant amplitude modulation schemes), can benefit from the use of switching RF power amplifiers, since such power amplifiers can improve the handset transmit efficiency. Challenges may exist in obtaining an efficient way of driving the output stage of a switching RF amplifier. In some switching RF amplifiers, input capacitance of the output stage can be as high as 30-50 pF. In such cases, driving the output stage at RF frequencies can result in dissipation of a significant portion of the total power drawn from the power supply by the RF power amplifier. The present disclosure describes exemplary embodiments that may prevent such loss of power and may improve power efficiency of the corresponding RF amplifier by saving the energy stored in the input capacitance of the output stage of a switching RF amplifier for each RF cycle rather than dissipating it. In this way, the energy can be stored in an inductor and therefore, the stored energy can be reused in the subsequent RF cycle to turn the output switching device ON with higher driving efficiency. Such a technique may be used in class E, F, D, and C amplifiers to save power and, therefore, to improve the overall power efficiency of the amplifier.

As known by a person skilled in the art, a switching amplifier can be based on a switching device, for example, a semiconductor CMOS type transistor with two distinct states of operations, such as "ON" and "OFF". In a CMOS type transistor, the "ON" state can be defined as a state where the device enters in a minimum resistance state and linear region of operation. As known in the art, device resistance during the "ON" state of a transistor may be directly proportional to the conduction losses associated with the device. In other words, the less the device resistance during the "ON" state, the smaller the conduction losses of the device and therefore, the larger the device efficiency. During operation, when the switching device or the transistor in the RF power amplifier is in "ON" state, the current flowing through the transistor can charge one or more inductors in an output matching network and therefore, energy can be stored in the inductors. The lower the ON resistance of the transistor, the more energy can be stored in the inductor and therefore, less energy loss may occur during the "ON" state. In the present disclosure, "ON" state duty cycle is defined as the ratio of the time during which the device is "ON" to the total cycle time (e.g. an ON-OFF cycle) of the device. For a class E or F RF power amplifier, the "ON" state duty cycle is typically close to 50%.

In accordance with the present disclosure, the "OFF" state of a switching device or a transistor can be defined as the state when there is no current flowing through the device. In the case of a class E RF power amplifier, the "OFF" state is typically close to 50% of the total cycle. During the "OFF" state of a transistor in a RF power amplifier, the energy stored in the one or more inductors of the output matching network during the ON state can be released and circulated in the output matching network that couples the RF energy from the RF power amplifier to the output load.

Typically, the output power of a RF switching amplifier has a small dependency on the amplitude of the input driving signal. For example, in some embodiments, RF output power of a class E power amplifier can be changed only from 33 to 33.5 dBm if the input driving power changes from 0 to 10 dBm.

In a switching power amplifier with a fixed $V_{dd}$ supply voltage, the output signal can be proportional to the voltage of the power supply feeding the RF power amplifier. This relation can be expressed as follows:

$$V_{out} = k_s * V_{supply} \quad (1); \text{ where } k_s \text{ is a constant.}$$

For example, in some embodiments, a 3.5V supply can result in a 33 dBm RF output signal. In such cases, the output signal power has a low dependence on the RF power amplifier input signal as long as the input signal is above certain minimum power value ($P_{in\_min}$). In the exemplary embodiments of the present disclosure, ($P_{in\_min}$) can be assumed in the order of 0 dBm.

In contrast to the switching amplifier, for a linear power amplifier, the ON state with minimum resistance may occur for a small portion of the input RF wave cycle, if a linear relation between the input and the output signal is desired. For some linear power amplifiers, the input signal can modulate the resistance of the output RF device in such a way that a linear relation between the input and output RF signals can be achieved. Although various resonant circuits may be used in a linear power amplifier, such resonant circuits may not be configured to drive the amplifier's output devices constantly into an "ON" state or linear mode of operation for a significant portion of the total RF cycle. Whereas, as previously indicated, in the case of a class E switching RF power amplifier, the "ON" state can be around 50% of the total cycle. Moreover, a switching amplifier may have a constant output envelope amplitude irrespective of the input signal amplitude, whereas a linear amplifier may have a linear gain relation between the input signal amplitude and the output signal amplitude. Stages in a linear amplifier can be matched for impedance that enables the most efficient RF power transfer from input to output. The relation of the output signal to the input signal in a linear RF power amplifier can be represented as:

$$V_{out} = k_g * V_{in} \quad (2); \text{ where } k_g \text{ represents a gain constant.}$$

The present disclosure describes an implementation of a multistage amplifier (e.g., a two or three stage amplifier) circuit comprising at least a resonant circuit arrangement coupled between a first pre-driver amplifier and a second power amplifier (PA) acting as a final driver. In the exemplary embodiments of the present disclosure, a multistage amplifier is defined as an amplifier with two or more stages. In several exemplary embodiments of the present disclosure, the power amplifiers can be assumed to be switching amplifiers such as class B, F, D or C amplifiers. Different types of waveforms such as sinusoidal signals, square waves or sawtooth waves may be used in the power amplifiers. The switching RF power amplifiers described in the present disclosure may be used in applications such as cellular radios.

Exemplary embodiments disclosed herein generally disclose exemplary circuits and systems having transistors that are Field Effect Transistors (FETs). Those skilled in the art will recognize that other types of transistors, such as bipolar transistors, may be used in accordance with this disclosure. In accordance with the present disclosure, a transistor is to be considered as a three port device, where one port may be an input port and a second port may be an output port. In the case of a FET, one port is connected to the gate of the FET, a second port is connected to the drain of the FET, and a third port is connected to the source of the FET. As such, the input port of a FET may be directly or indirectly connected to the gate, drain, or source of the FET and, similarly, the output port of a FET may be directly or indirectly connected to the gate, drain, or source of the FET. In the case of a bipolar transistor, one port is connected to the base of the bipolar transistor, a second port is connected to the collector of the bipolar transistor, and a third port is connected to the emitter of the bipolar transistor. As such, the input port of a bipolar transistor may be directly or indirectly connected to the base, collector, or emitter of the bipolar transistor and, similarly, the output port of a bipolar transistor may be directly or indirectly connected to the base, collector, or emitter of the bipolar transistor. Input capacitance of a transistor is to be considered the capacitance present at the input port of the transistor. For example, the input capacitance of a FET may be the gate to source capacitance, if the FET is configured to have the FET gate coupled to the input port of the FET. Those skilled in the art understand that the input capacitance of a transistor will depend upon the type and configuration of the transistor.

FIG. 1 shows a multistage amplifier (100) comprising a pre-driver 101 and a final stage amplifier 110. In the exemplary multistage amplifier 100 of FIG. 1, the pre-driver 101 has an input terminal 107 and an output terminal 103 and is connected to a DC supply $V_{DD1}$. The pre-driver 101 may be connected to the final stage amplifier 110 at the input terminal 114 of the final-stage amplifier 110 through the output terminal 103 of the pre driver 100. The final stage amplifier 110 may comprise one or more FETs stacked together. In the exemplary embodiment of FIG. 1, the final stage amplifier 110 comprises a stack of three FETs: a first FET 111 ($M_1$), a second FET 113 ($M_2$) and a third FET 115 ($M_3$), connected to each other in series. The first FET 111 among the stack of three FETs 111, 113, 115 of the final stage amplifier 110 may be considered as a first subset of FET(s), and the second ($M_2$) and the third ($M_3$) FETs 113, 115 among the three FETs of the final stage amplifier 110, may be considered as a second subset of FET(s). In some embodiments, if the stack of FETs comprises more than three FETs (e.g., four FETs), the second, third, and fourth FETs may be considered as a part of the second subset of FETs.

In several exemplary embodiments of the present disclosure, the disclosed FETs may be assumed to be MOSFETs. As discussed above, a person skilled in the art would recognize that, in the exemplary embodiments of the present disclosure, other types of transistors, for example, bipolar junction transistors (BJTs) may be used as well, instead or in combination with the MOSFETs. In the exemplary embodiments of FIG. 1, the final stage amplifier 110 may be connected to a DC voltage supply $V_{DD2}$ at the drain terminal of the third FET 115 among the stack of three FETs, through an inductor 118 having inductance $L_2$. The inductor 118 may be configured to act as an RF choke. A regulated DC source $V_{DD3}$ may be connected at the gate terminals of the second FET 113 and the third FET 115 through a resistive divider network 130 having a resistance of $R_{VDD3}$ to supply a transistor specific DC bias voltage at the gates of the FETs 113 and 115. The resistive divider network 130 may be used to regulate the DC bias voltage to the gates of the second FET 113 and the third FET 115 in such a way that the applied DC bias at the gate terminals of FETs 113, 115 can result in a desired division of an output RF voltage swing at the drain terminal of the third FET 115, between the FETs 111, 113, 115 of the final stage amplifier 110. Capacitors 132, 134 having capacitances of $C_{M2}$ and $C_{M3}$ may be correspondingly connected at the gate terminals of the second FET 113 and the third FET 115 to the ground to bypass noise and shunt any voltage/current spikes to the ground. It should be noted that although the various figures of this disclosure show a reference ground for a return current path, in general such reference can effectively be a reference potential, such as a system reference ground, an RF (e.g. AC) ground or a virtual ground, all of which the skilled person is well aware of. Therefore the reference ground (e.g. ground) as used in this disclosure and figures should not be regarded as limiting the scope of the invention as disclosed herewith, but rather as an exemplary reference potential. The gate capacitors 132, 134 can allow gate voltages (voltage across the respective gate capacitor) of the third FET 115 and the second FET 113, respectively, to float, that is let the gate voltages vary along with the RF signal at the drain of the corresponding FETs (115, 113), which consequently allow control (e.g. evenly distribute) of the voltage drop across the two transistors for a more efficient operation of the two transistors. See for example, U.S. Pat. No. 7,248,120, issued on Jul. 24, 2007, entitled "Stacked Transistor Method and Apparatus", which is incorporated herein by reference in its entirety.

In FIG. 1, the drain of the third FET 115 among the stack of FETs of the final stage amplifier 110, can be connected to an output terminal 116 of the final stage amplifier 110, which can further be connected to a load 140 with resistance $R_L$ through an output stage 120. In the exemplary embodiment of FIG. 1, a first terminal of the output stage 120 may be connected to the output terminal 116 of the final stage amplifier 110 and a second terminal of the output stage 120 can be connected to the load 140. The load 140 is further connected to the ground. The output stage 120 may comprise a capacitor 122 (having capacitance $C_2$) connected between the first terminal of the output stage 120 and ground to short out undesired high frequency components, and a series combination of a inductor 126 (with inductance $L_3$) and a capacitor 124 (with capacitance $C_3$) may be connected between the first terminal and the second terminal of the output stage 120. A person skilled in the art would recognize that such a circuit arrangement of the final stage amplifier 110 as a class E amplifier, but would understand that other types of amplifier configuration may also be possible. It is well known in the field that, a class E PA (power amplifier) final stage should be driven with a signal that, for best efficiency, has fast rising and falling edges. Signals with fast rising and falling edges are typically desired for all classes of switching amplifiers. The exemplary multistage amplifier configurations of the present disclosure may achieve good rising and falling edges at the output 103 of the pre-driver 101 with less power required from a power supply or battery.

In the exemplary embodiment of FIG. 1, the input capacitance of the final stage amplifier 110, i.e., the gate to source capacitor 112 (shown as capacitance $C_{gs}$ in FIG. 1) of the first FET 111, among the stack of FETs of the final stage amplifier 110, may be as high as 30-50 pF or higher. In the exemplary embodiment of the FIG. 1, the final driver 110 is configured as a class E switching power amplifier. As previously indicated, in this case, driving the output device at RF frequencies can result in dissipation of significant portion of the total power drawn from the power supply by the RF power amplifier. During the operation of the multistage amplifier 100, the gate to source capacitor 112 internal to the first FET 111 of the final stage amplifier (120), will be charged by the current flowing from the power source $V_{DD1}$. That is, during the charging cycle of the gate to source capacitor 112 internal to the first FET 111, the current from the power source $V_{DD1}$ will flow through the pre-driver 101 and the gate to source capacitor 112, and energy will be stored at the capacitor 112.

During the discharging cycle of the gate to source capacitor 112 of the first FET 111 among the stack of FETs of the final stage amplifier 110, the capacitor 112 will discharge through ground and thus the power stored in the capacitor 112 during its charging cycle will be lost to the ground, resulting in power loss. If the power source $V_{DD1}$ is, for example, a battery, such power consumption can reduce the battery life as well as the overall power efficiency of the circuit. In order to reduce this loss of power through the capacitor 112, the present disclosure describes a resonant circuit arrangement, which can be incorporated between the pre-driver 101 and the final stage amplifier 110 to supplement power, and thereby reduce the amount of power that is drawn from the power source $V_{DD1}$ as well as to improve the power efficiency of the overall circuit.

Figure 2:
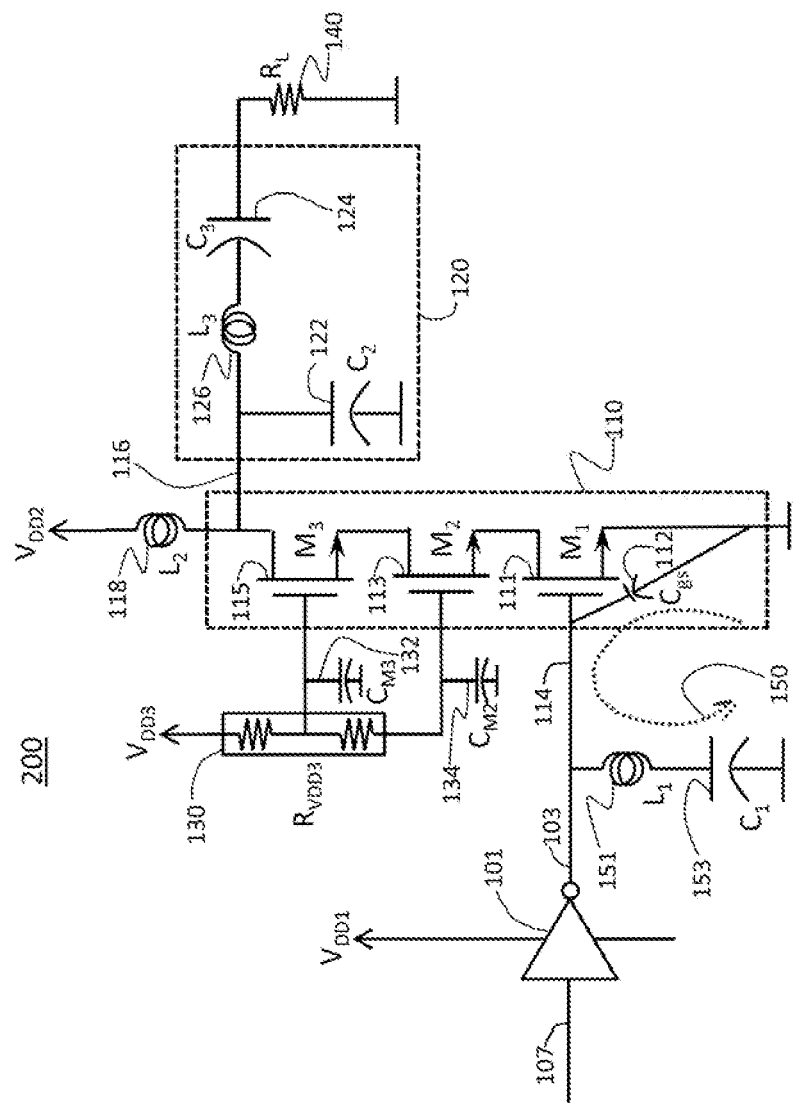
FIG. 2 shows a two stage amplifier device comprising a resonant pre-driver with a class E final stage power amplifier (PA).

The loss of power during the discharging cycle of the gate to source capacitor 112 of the first FET 111 among the stack of FETs of the final stage amplifier 110, may be avoided and thus power efficiency of the corresponding RF amplifier may be improved by saving the energy stored in the capacitor 112 for each RF cycle rather than dissipating it. FIG. 2 shows an advanced arrangement 200 of the multistage amplifier of FIG. 1 with an L-C arrangement comprising an inductor 151 (with inductance $L_1$) and a capacitor 153 (with capacitance $C_1$) connected in series with each other between the output terminal 103 of the pre-driver 101 and the ground. The inductor 151 of the L-C arrangement forms a parallel L-C resonant circuit arrangement with the gate to source capacitor 112 of the first FET 111 of the final stage amplifier 110. Such a parallel L-C resonant circuital arrangement (inductor 151 parallel with capacitor 112 of the FET 111) in the exemplary embodiment of FIG. 2 may save the energy stored in the gate to source capacitor 112 of the first FET 111 of the final stage amplifier 110 during its charging cycle, and, therefore, increase the overall power efficiency of the multistage amplifier 200.

Figure 3A:
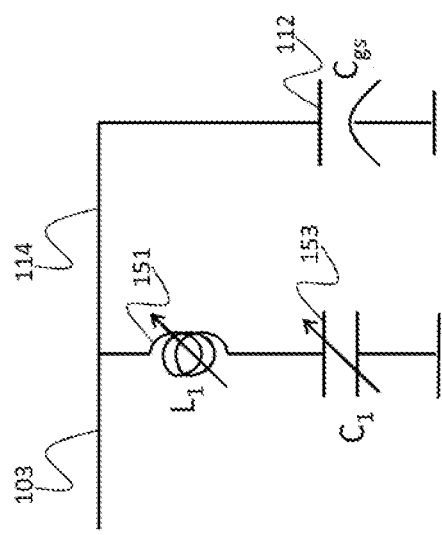
FIG. 3A shows an equivalent representation of an inductor-capacitor (L-C) resonant circuit at the input of the final stage amplifier.

In the exemplary embodiment of FIG. 2, as previously indicated, the inductor 151 forms a parallel L-C resonance with the gate to source capacitor 112 of the first FET 111 (from the stack of FETs) of the final-stage amplifier 110. In this configuration, the inductance of the inductor 151 ($L_1$) may be in the range of 150 to 250 pH and the series capacitor 153 may act as a DC block to maintain a desired DC biasing at the gate of the first FET 111 among the stack of FETs of the final stage amplifier 110, as well as to bypass noise and shunt any RF voltage/current spikes to the ground. As known by a person skilled in the art, the capacitance of the DC block capacitor 153 may be larger than the capacitance of the input capacitor of the final stage amplifier 110, i.e., the gate to source capacitor 112 of the first FET 111) from the stack of FETs of the final-stage amplifier 110. The addition of the DC block capacitor 153 in the exemplary circuit depicted in FIG. 2, may shift the resonant frequency of the overall circuit of FIG. 2 to a slightly higher frequency in comparison to the resonant frequency of the exemplary multistage amplifier arrangement of FIG. 1. Inductor 151 may be adjusted accordingly in order to compensate the effects due to the shift of resonant frequency of the circuit. Therefore, inductance values outside of the range of 150 to 250 pH may also be used. An exemplary embodiment of such parallel L-C resonance circuital arrangement is shown in FIG. 3A. According to some embodiments of the present disclosure, capacitor 153 and/or inductor 151 can be tunable/variable, as depicted in FIG. 3A, such as to allow fine tuning of the resonant frequency of the circuit. Such tunable capacitor and/or inductor can be a digitally tunable capacitor (DTC) and/or digitally tunable inductor (DTL), such as described, for example, in PCT publication number WO2009/108391 entitled "Method and Apparatus for use in Digitally Tuning a Capacitor in an Integrated Circuit Device", published on Sep. 3, 2009, and in U.S. patent application Ser. No. 13/595,893 entitled "Methods and Apparatuses for Use in Timing Reactance in a Circuit Device", filed on Aug. 27, 2012, both incorporated by reference herein in their entirety, where examples of digital tuning capacitors and/or digital tuning inductors for use in a various networks are disclosed.

Figure 3B:
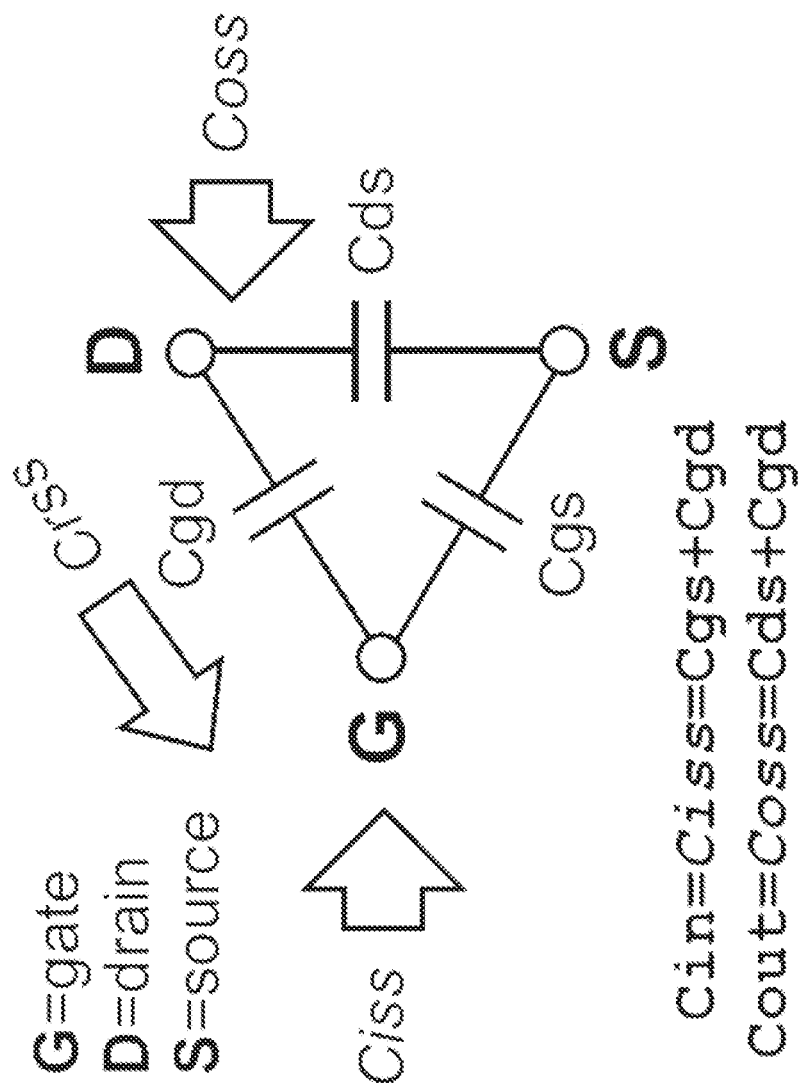
FIG. 3B shows the various capacitances of an input transistor of the final stage amplifier of FIGS. 1 and 2.
Figure 3C:
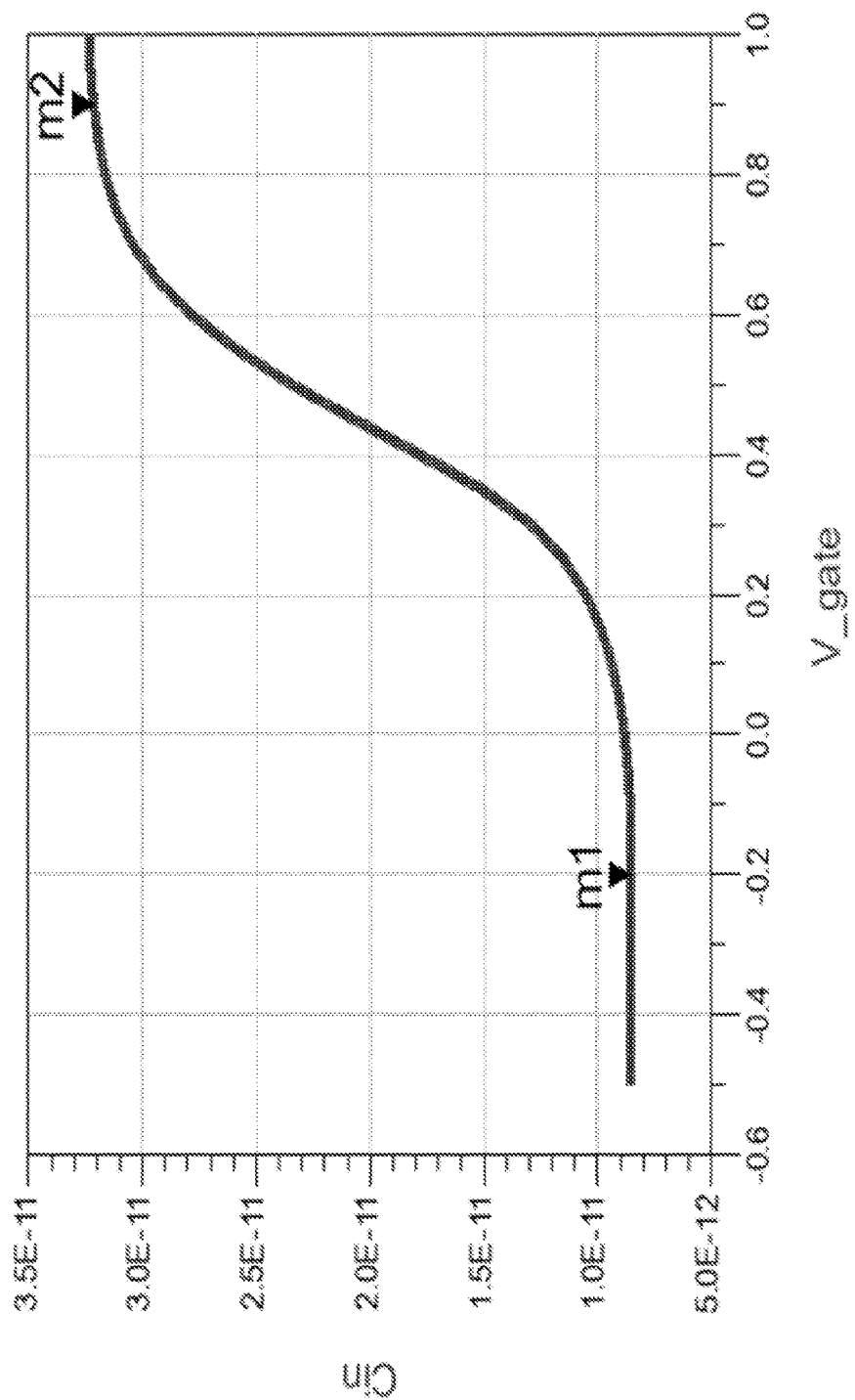
FIG. 3C shows an equivalent input capacitance of a switching amplifier.

FIG. 3B is a graphical representation of the various capacitances at various terminals (e.g. G=gate, D=drain, S=source) of an input transistor (e.g. transistor M1 of the various figures of the present disclosure) used at the input stage of a switching amplifier (e.g. class D/E/F, such as amplifier 110 of the various figures of the present disclosure). This figure is obtained from the article "MOSFET "Switched Mode" Amplifiers", by Paul Harden, publicly available at www.n-rao.edu, downloaded on Sep. 16, 2013, which is incorporated herein in its entirety. As depicted by in FIG. 3B, the input capacitance Ciss (e.g. Cin) to the input transistor (e.g. M1 of FIGS. 1 and 2) is the gate-source capacitance Cgs, plus the reverse transfer capacitance Crss. As noted by the same article, the input capacitance Ciss changes value between an ON state and an OFF state of the input transistor, mainly due to the change in capacitance value of the reverse transfer Crss capacitance between the two states. Such change in capacitance value is a function of the drain current, which when starting to flow, due to an input voltage Vgate applied to the input gate of the transistor (e.g. as referenced to the voltage at the source terminal of the transistor), a portion of the output capacitance Coss reflects back to the gate in the form of Crss. The reflected back capacitance Crss varies as the Vgate voltage varies (e.g. increasing input voltage to the amplifier), from a low fixed capacitance value during the cutoff region (e.g. mode of operation) of the transistor (e.g. Vgate<Vthreshold), to a varying capacitance value during the triode region of the transistor (e.g. Vgate>Vthreshold and Vds<(Vgate−Vthreshold)), and a high constant capacitance value during the saturation region of the transistor (e.g. Vgate>Vthreshold and Vds≥(Vgate−Vthreshold)), wherein the cutoff region may be associated to the OFF state of the transistor and the triode/saturation regions to the ON state of the transistor. The various input capacitance values as function of the input voltage Vgate of the transistor, as the transistor goes through the mentioned three regions of operation, are depicted in FIG. 3C which is later described. Although the various figures of the present disclosure only show the Cgs capacitance of the input transistor to the switching amplifier, it is understood that this represents the effective capacitance Ciss as depicted in FIG. 3B and further explained in the references Harden article. The skilled person readily knows that this specific attribute of a switching amplifier, wherein during operation of the amplifier a corresponding input transistor operates in all three regions (e.g. dependent on the input voltage to the amplifier), thus affecting the input capacitance value of the amplifier largely, renders driving of the switching amplifier more critical as opposed, for example, to driving a different type of amplifier, such as a class A or A/B.

As mentioned in the previous paragraph, the input capacitance of the final stage amplifier (e.g. switching amplifier), as used in the various embodiments of the present disclosure (e.g. final amplifier 110 in the various figures of the present disclosure), varies with the input voltage Vgate (e.g. voltage between gate and source of a corresponding input transistor) applied to the input of the amplifier, as shown in FIG. 3C. According to some embodiment of the present disclosure, at low input voltage (e.g. during the cutoff region of the input transistor M1), the input capacitance of the switching amplifier can be around 8.5 pF as shown by the marker m1 of FIG. 3C. Input voltage shown by marker m1 can correspond to an OFF state of the switching amplifier final stage which in this OFF state has an input capacitance of 8.5 pF. At high input voltage (e.g. during the saturation region of the input transistor M1), as shown by the marker m2 of FIG. 3C, the input capacitance of the switching amplifier can be around 32.1 pF. Input voltage shown by marker m2 can correspond to an ON state of the final stage amplifier which in the ON state has an input capacitance of 32.1 pF. The difference in input capacitance of the final stage amplifier between its ON and OFF state can impact selection of the inductor (e.g. L1, L5, $L_R$ of FIGS. 2-8) when enhanced efficiency in recirculation of energy between the amplifier input capacitance and the resonant inductor is desired.

In the exemplary embodiment of FIG. 2, the gate terminal of the first FET 111 may be coupled to the input terminal 114 of the final-stage amplifier 110. As indicated in previous paragraphs, the power source $V_{DD1}$ may supply power to the pre-driver 101 of the multistage amplifier 200. In the exemplary embodiment of FIG. 2, in order to charge the capacitors 153, 112 during a charging cycle of the capacitors 153, 112, electrical power from the DC power source $V_{DD1}$ may follow two different paths: i) through the pre-driver 101 and the inductor 151 to the DC block capacitor 153 and ii) through the pre-driver 101 to the gate terminal of the first FET 111 of the final driver 110 and then to the gate to source capacitor 112 of the first FET 111. As well known by a person skilled in the art, during a charging cycle of a capacitor, a capacitor will store energy in an electric field between its two plates depending on the voltage across the capacitor's plates. Therefore, during the charging cycle of the gate to source capacitor 112 of the first FET 111, energy will be stored in the capacitor 112.

During the discharging cycle of the capacitor 112, the capacitor 112) can discharge the stored energy through the inductor 151 since the inductor 151) is connected in parallel across the gate to source capacitor 112 of the first FET 111. As known in the art from the theory of the inductors, an inductor stores energy in a magnetic field depending on the current through the inductor. In some embodiments, during the discharging cycle of the capacitor 112 through the inductor 151, the inductor 151 may oppose any changes in the flow of current through the circuit by changing the magnetic field flux around the inductor itself. In such cases, once the capacitor 112 is fully discharged, the magnetic field around the inductor 151 can start to collapse and this can initiate a current flow from the inductor 151 to the capacitor 112, thus charging the capacitor 112 but with an opposite polarity.

As known by a person skilled in the art that, in an ideal L-C circuit where there is no power dissipation or active power loss due to resistance/resistances (internal or external), the stored energy in an L-C resonant circuit can continue back and forth infinitely between an inductor and a capacitor. In case of an actual circuit, for example, as shown in the exemplary circuital arrangement of FIG. 2, the internal resistances of the components (power amplifiers and FETs) and the resistances of the connecting wires can eventually force this oscillation of energy between the capacitor 112 and the inductor 151 to diminish. In the example embodiment of FIG. 2, the energy stored in the parallel L-C resonant circuital arrangement between the capacitor 112 and the inductor 151 may supply gate driving current and voltage to the first FET 111, which is coupled to the input terminal 114 of the final stage amplifier 110, during the flow of energy from the inductor 151 to the capacitor 112 of the FET $_{112}$. Since, in the exemplary circuit of FIG. 2, the stored energy in the capacitor 112 of the FET 111 can flow back and forth between the gate to source capacitor 112 of the first FET 111 and the inductor 151, the gate of the FET 111 may be provided with added driving current, As mentioned earlier, if the voltage source $V_{DD1}$ is a battery, the oscillation of energy between the gate to source capacitor 112 of the first FET 111 and the inductor 151 of the parallel resonant circuit arrangement can enable the overall circuit arrangement of the multistage amplifier 200 of the exemplary embodiment of FIG. 2 to draw less driving current as well as less power from the battery supply, thus improving the overall power efficiency of the circuit.

In the exemplary multistage amplifier arrangement of FIG. 2, a person skilled in the art can choose the value of the input capacitance (i.e, the gate to source capacitance) of the first FET 111 of the final-stage amplifier 110 according to a device specification. Values for the remaining components in the exemplary multistage amplifier arrangement 200 can be selected by a person skilled in the art, based on desired results, by specifying the inductance value of the inductor 151 and the capacitance value of the capacitor 153. The component values of the parallel resonant arrangement comprising the gate to source capacitor 112 of the first FET 111 of the final stage amplifier 110, in parallel with the series combination of the inductor 151 and the capacitor 153, may be selected in such a way that the resonance frequency of the parallel resonant arrangement may be close to the driving frequency (e.g. operating frequency) of the amplifier circuit 200. As well known in the art, the resonance frequency may be determined by the following equation:

$$f=1/(2*pi*(L*C_{total})^{1/2}) \text{ where } 1/C_{total}=1/C_{Decoupling}+1/C_{gs} \quad (1)$$

The resonance frequency of the parallel resonant circuit arrangement (comprising the inductor 151 and input capacitor 112 of FIG. 2, may be dependent on the value of the input capacitor 112 and the resonance inductor 151, since, as mentioned previously, in some embodiments, the capacitance of the decoupling capacitor 153 may be much larger than the capacitance of the gate to source capacitor 112. Therefore, while calculating the resonant frequency of the parallel resonant circuit arrangement of FIG. 2, the capacitance of the decoupling capacitor 153) may be ignored.

In accordance with the present disclosure, in the exemplary arrangement of FIG. 2, the amount of energy which may be provided from the parallel resonant circuit arrangement to the multistage amplifier 200, may depend on the resonant frequency of the parallel resonant circuital arrangement (obtained from equation (1)), and therefore, the amount of additional energy required from the energy source $V_{DD1}$ in order to drive the circuit, may be determined as well. In some embodiments, simulations show that the resonant inductor pre-driver topology, as shown in the exemplary embodiment of FIG. 2, may improve the total efficiency of a High Band PA by approximately 2-3%. This improvement can be realized by lowering the amount of current required to drive the final stage amplifier of a multistage amplifier, as shown in the exemplary embodiment of FIG. 2.

Figure 4E:
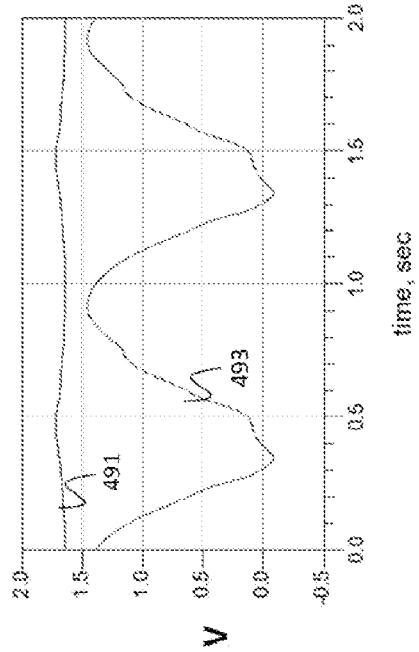
FIGS. 4D-4H show voltage or current waveforms at various points of the embodiments depicted in FIGS. 4A-4C.
Figure 4F:
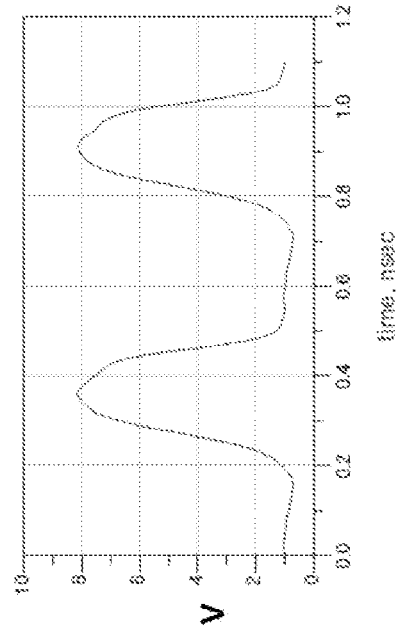
Figure 4A:
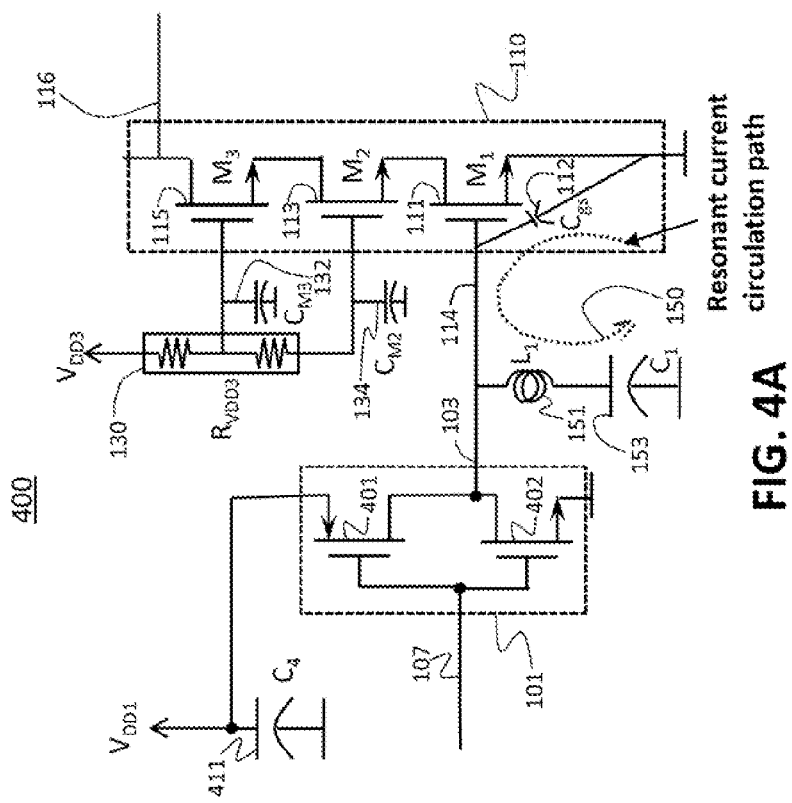
FIG. 4A shows an example embodiment of the multistage amplifier of FIG. 2 with a pair of FETs representing the pre driver.
Figure 4G:
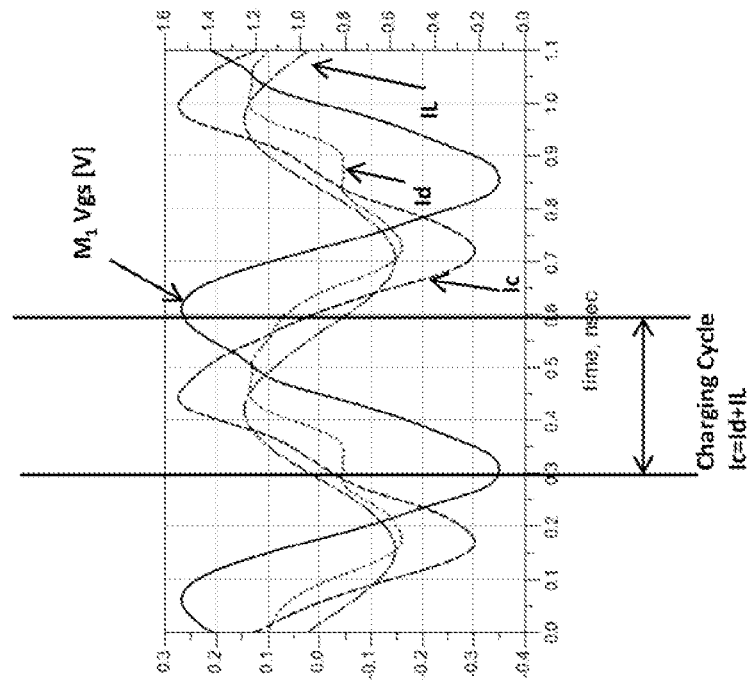
Figure 4B:
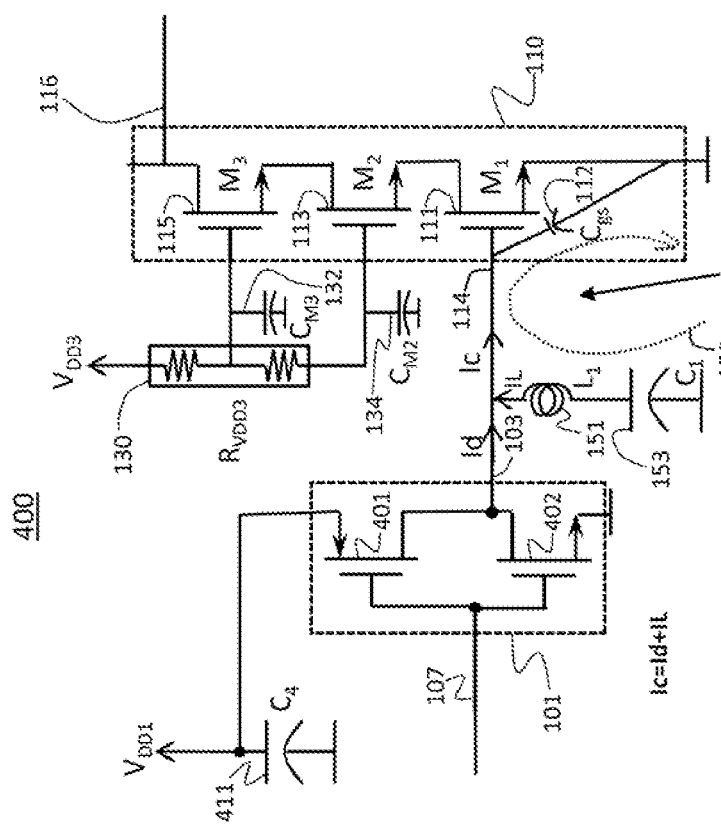
FIG. 4B and FIG. 4C show the resonant current circulation path of FIG. 4A during charging and discharging cycle of the capacitor $C_{gs}$.
Figure 4H:
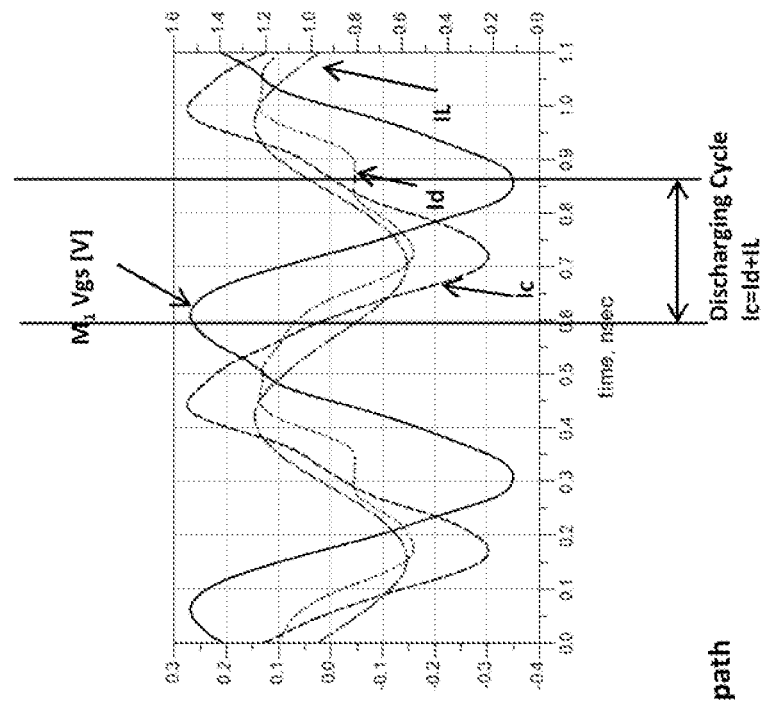
Figure 4C:
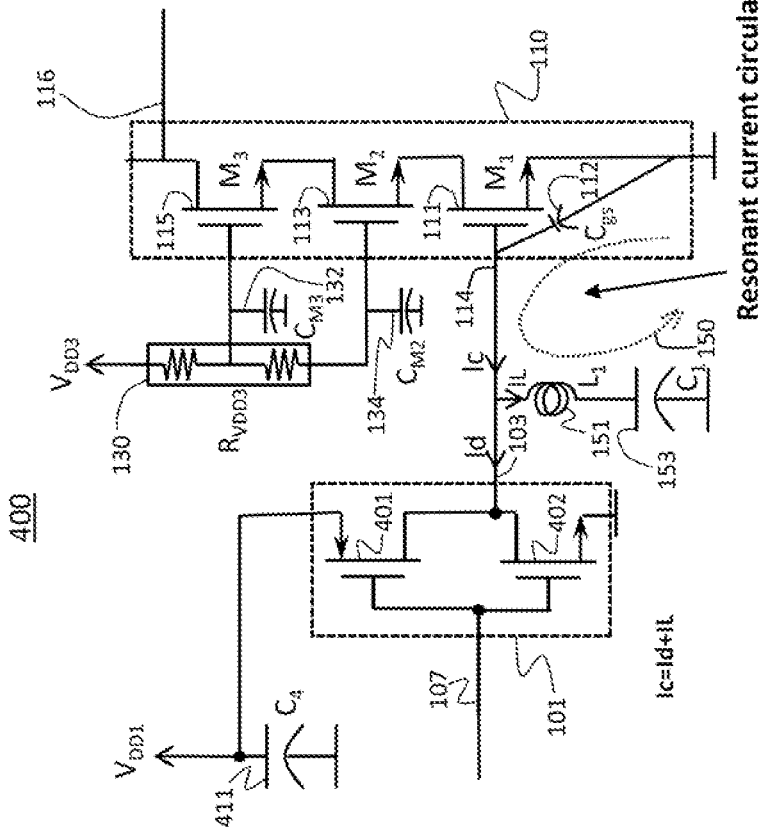

In the exemplary circuit arrangement of FIG. 2, the resonating current 150 circulating in the inductor 151 and the gate to source capacitor 112 of the first FET ($M_1$) of the final stage amplifier 110, can augment the driving capacity of the pre-driver, as shown in FIGS. 4B and 4C and discussed in later section. For example, the exemplary circuital arrangement of FIG. 2 may be implemented within the frequency range of 1710-1910 MHz, if capacitance of the gate to source capacitor 112 of the first FET 111 is assumed between 30-50 pF and the inductance of the resonant inductor 151 is assumed in the range of 150-250 pH. The resonant pre-driver amplifier 101, as shown in the exemplary embodiment of FIG. 2, may be implemented in various ways. For example, the exemplary resonant pre-driver amplifier arrangement of FIG. 2, may be implemented with multiple pre-drivers and final amplifiers connected in parallel, while alone or together the multiple pre-drivers have their respective outputs tied to a resonance circuit.

As mentioned in prior paragraphs of the present disclosure and in reference to the graph in FIG. 3C, the input capacitance 112 varies between the ON and OFF state of the final stage amplifier 110. A desired inductor selection as per prior paragraph, can comprise assuming the maximum input capacitance (e.g. ON state) of around 32.1 pF and based on this assumed value, selecting the inductive reactance of the resonant inductor 151 at an operating frequency of the amplifier to equate the capacitive reactance of the input capacitance at the same frequency. Such selection of the resonant inductor allows a more efficient recirculation of energy stored in the capacitor and inductor during operation of the resonant pre-driver switching amplifier presented in the various embodiments according to the present disclosure. The skilled person will need no further details about the concept of inductive and capacitive reactance.

According to an exemplary embodiment of the present disclosure, FIG. 4A shows an exemplary circuit arrangement of a multistage amplifier 400 similar to the multistage amplifier arrangement of FIG. 2, where the pre driver 101 comprises a pair of stacked FETs 401, 402. In the exemplary circuit arrangement of FIG. 4A, the input 107 of the pre-driver 100 is connected to the combined gate terminal of the pair of stacked FETs 401, 402, where FET 401 is a P-type FET and FET 402 is a N-type FET. As shown in the exemplary circuit arrangement of FIG. 4A, the source $V_{DD1}$ may be connected at the source terminal of the FET 401 to supply voltage and current required for driving the pair of stacked FETs 401, 402 internal to the pre-driver amplifier 101. As shown in the exemplary embodiment of FIG. 4A, a decoupling or bypass capacitor 411 (with capacitance $C_4$) may be placed between the source $V_{DD1}$ and the ground, which may then bypass any noise and shunt any voltage/current spikes to the ground. As previously indicated during discussion of FIG. 2, in the exemplary circuit arrangement of FIG. 4A, the capacitance of the decoupling capacitor 411 may be larger than the capacitance of the gate to source capacitor 112 of the first FET 111 among the stack of three FETs of the final stage amplifier 110.

Figure 4D:
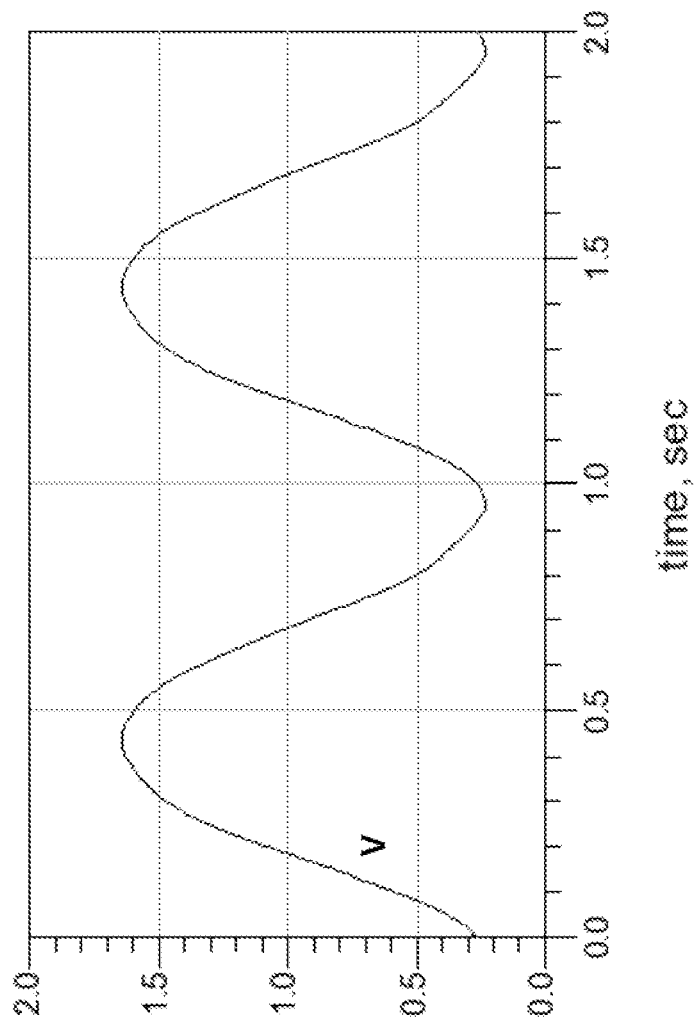

FIGS. 4D-4F show different voltage waveforms at multiple points of the multistage amplifier circuit 400 in response to an input sinusoidal voltage at the pre-driver's 100 input terminal 107. FIG. 4E shows the input sinusoidal signal present in input terminal 107. Similar to the exemplary circuit arrangement of FIG. 2, FIG. 4A shows a series combination of the inductor 151 and the DC block capacitor 153 connected between the output terminal 103 of the pre driver 101 and the ground. This series combination forms a parallel L-C resonant circuit with the gate to source capacitor 112 of the FET 111 of the final stage amplifier 110. In this configuration, the resonant current circulation path 150 may be localized between the resonant inductor 151 and the gate to source capacitor 112 of the FET 111 of the final stage amplifier 110, which may improve the overall efficiency of the circuit. As discussed previously, due to this L-C resonance, an oscillation of power may take place between the resonant inductor 151 and the gate to source capacitor 112 of the FET ($M_1$) of the final stage amplifier FIG. 4E shows the voltage supplied by the power supply $V_{DD1}$ with line 491, while line 493 shows the voltage at the input terminal 114 to the final stage amplifier 110. The "power oscillation" allows the multistage amplifier circuit arrangement of FIGS. 2 and 4A-4C to draw less driving current as well as less power from the battery supply, thus improving the overall power efficiency of the circuit. FIG. 4F shows the voltage at the output terminal 116 on the final stage amplifier 110.

FIGS. 4G and 4H show different current waveforms of the exemplary circuital arrangement of FIG. 4A, during charging and discharging cycle of the gate to source capacitor 112 of the FET 111 of the final stage amplifier 110. The first FET 111 from the stack of FETs of the final-stage amplifier circuit (110) may be configured to turn ON during the charging cycle of the gate to source capacitor 112 of the first FET 111 of the final-stage amplifier circuit 110. During this cycle, the charging current $I_c$ of the gate to source capacitor 112 of the first FET 111 of the final-stage amplifier circuit 110, can be augmented by the resonant current IL. FIG. 4B shows the direction of the resonant current 150 during the charging cycle. The current $I_c$ may also be the gate charging current of the first FET 111 of the final-stage amplifier circuit 110. FIG. 4G shows different current waveforms, obtained from simulations, within the circuit during the charging cycle of the gate to source capacitor 112.

As shown in FIG. 4B, the charging current ($I_c$) of the gate to source capacitor 112 of the first FET 111 of the final-stage amplifier circuit 110, is the sum of the driving current Id from the pre-driver 101 and the current IL from the resonant inductor 151. This current sum results in a more efficient driving of the gate of the first FET 111 of the final-stage amplifier circuit 110. This in turn may reduce the power drawn from the $V_{DD1}$ supply.

As shown in FIG. 4C, the discharging of the gate to source capacitor 112 of the first FBI 111 can turn OFF the first FET 111 of the final stage amplifier 110 during the discharging cycle of the gate to source capacitor 112 of the first FET 111), through the resonant inductor 151. Moreover, similar to charging cycle, during the discharging cycle, the discharging current L can be augmented by the resonant current IL from the resonant inductor 151, and therefore part of the energy discharged by the gate to source capacitor 112 of the first FET 111 during the discharging cycle, can be stored in the resonant inductor 151. FIG. 4C shows the direction of the resonant current 150 during the discharging cycle. Subsequently, during the next charging cycle of the gate to source capacitor 112 of the first FET 111, the energy stored in the resonant inductor 151 during the previous discharging cycle of the gate to source capacitor 112 of the first FET 111 can be delivered back to the gate to source capacitor 112 of the first FET 111. FIG. 4H shows different current waveforms of the multistage amplifier 400 during the discharging cycle of the gate to source capacitor 112 of the first FET 111.

According to an exemplary embodiment of the present disclosure, FIG. 5A shows an exemplary circuit arrangement of a multistage amplifier 500 similar to the multistage amplifier arrangement of FIG. 2, with a FET 501 and a DC-biasing resistor 517 (with resistance $R_b$) connected at the output terminal 103 of the pre-driver 101. In the exemplary embodiment of FIG. 5A, the output 103 of the pre-driver 101 is connected at the gate terminal of a FET 501. Although N-type MOSFETs are used to describe the present embodiment, a person skilled in the art would recognize that other types of transistors, for example, P-type MOSFETs, bipolar junction transistors (BJTs) etc., may be used as well instead or in combination with the N-type MOSFETs. In the exemplary embodiment of FIG. 5A, a source $V_{DD\_PRE}$ may supply voltage to the FET 501. As shown in FIG. 5A, the source $V_{DD\_PRE}$ may be connected to the FET 501 at the drain terminal of the FET 501 through an inductor 513 (having inductance $L_4$). The inductor 513 may serve as a resonant inductor in the circuit arrangement of FIG. 5A. Similar to the exemplary circuit arrangement of FIGS. 4A-4C, in the exemplary circuit arrangement of FIG. 5A, a decoupling or bypass capacitor 511 (having capacitance $C_{51}$) can be placed between the source $V_{DD\_PRE}$ and the ground to bypass noise and shunt any voltage/current spikes to the ground.

In the exemplary embodiment of FIG. 5A, a capacitor 515 (having capacitance $C_5$) may be placed between the drain terminal of the FET 501 and the gate terminal of the first FET 111 of the final stage amplifier 110, where the capacitor 515 may serve as a DC block capacitor. In the exemplary circuit arrangement of FIG. 5A, a DC-biasing resistor 517 may be connected between the gate terminal of the first FET 111 and the output terminal 103 of the pre-driver 101 to provide a DC path to the gate of first FET 111. The resistor 517 may provide the circuit shown in FIG. 5A with a gate bias of the first FET 111 of the final stage amplifier 110. In the exemplary embodiment of FIG. 5A, the inductor 513 may be configured to form a parallel L-C resonant circuit arrangement with the gate to source capacitor of the first FET 111 of the final stage amplifier 110. Similar to the circuit arrangement of FIGS. 4A-4C, this parallel L-C resonance arrangement may provide that an oscillation of power occurs between the inductor 513 and the gate to source capacitor of the first FET 111 of the final stage amplifier 110. FIG. 5A shows the resonant path 520, while FIG. 5B shows the voltage across the capacitor 511 with line 512 and the voltage at the input terminal 114 of the final stage amplifier 110 with line 521. The oscillation of power between the inductor 513 and the gate to source capacitor of the first FET 111 of the final stage amplifier 110 may allow the circuit arrangement of the multistage amplifier 500 to draw less driving current as well as less power from the battery supply, thus improving the power efficiency of the overall circuit. However, an integrated circuit implementation of the exemplary embodiment of FIG. 5A may be more difficult to achieve than an integrated circuit implementation of the circuits depicted in FIGS. 4A-4C.

Figures 6, 7:
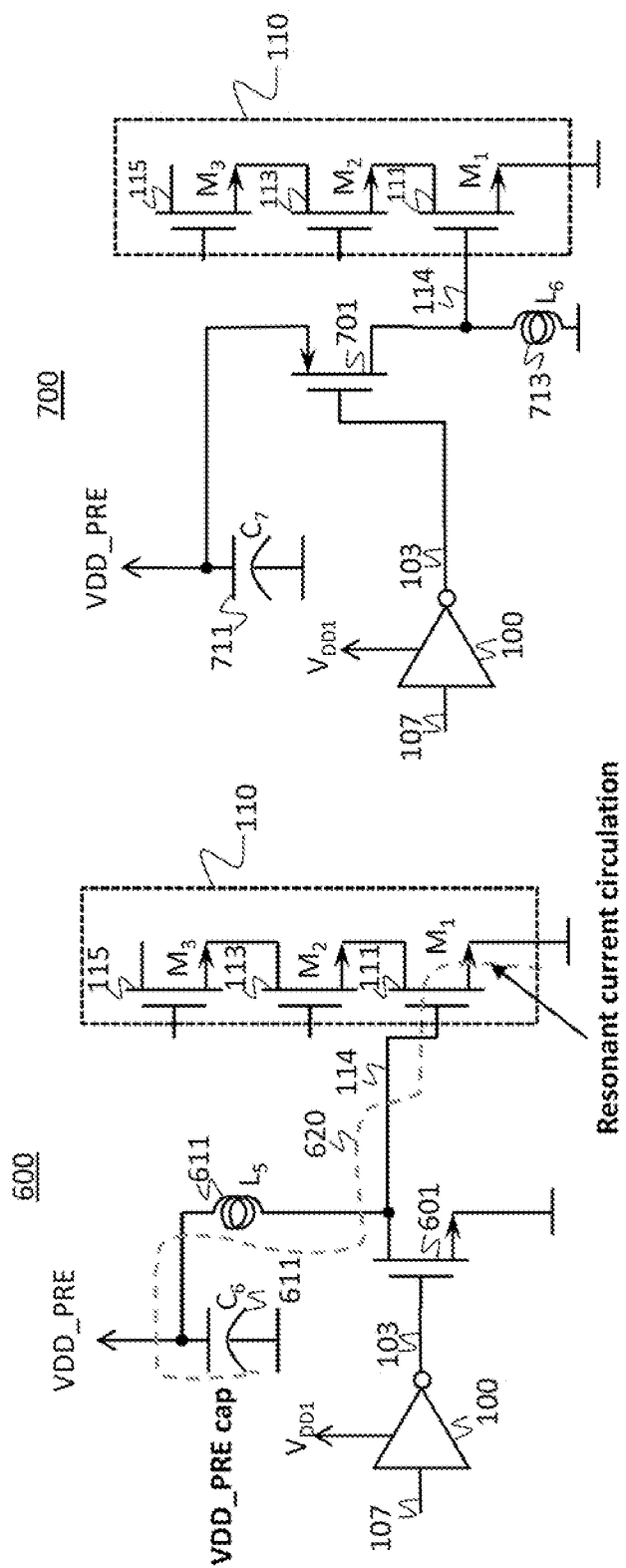
FIG. 6 shows an example embodiment of the multistage amplifier of FIG. 2 with a FET connected at the output terminal of the pre-driver.
FIG. 7 shows a different embodiment of the multistage amplifier of FIG. 2 with a P-type MOSFEET connected at the output terminal of the pre-driver.

In accordance with the present disclosure, FIG. 6 shows another exemplary embodiment of a multistage amplifier 600 similar to the multistage amplifier arrangement of FIG. 2 with a FET 601 connected at the output terminal 103 of the pre-driver 101. In the exemplary embodiment of FIG. 6, the output 103 of the pre-driver 101 may be connected to the gate terminal of a FET 601. Although N-type MOSFETs are assumed to describe the exemplary embodiment of FIG. 6, a person skilled in the art would recognize that other types of transistors such as, for example, P-type MOSFETs or bipolar junction transistors (BJTs), may be used instead of or in combination with the N-type MOSFETs.

Similar to the exemplary embodiment of FIG. 5, in the exemplary embodiment of FIG. 6, the source $V_{DD\_PRE}$ may supply power to the FET 601 and it may be connected to the FET 601 at the drain terminal of the FET 601 through an inductor 611 (having an inductance $L_5$). In the exemplary circuital arrangement of FIG. 6, the inductor 611 may serve as a resonant inductor. Similar to the previous embodiments of FIGS. 4A and 5, a decoupling or bypass capacitor 611 (having a capacitance $C_6$) may be placed between the source $V_{DD\_PRE}$ and the ground to bypass noise and shunt any voltage/current spikes to the ground. In the exemplary embodiment of FIG. 6, the inductor 611 may be configured to form a parallel L-C resonant circuit configuration with the gate to source capacitor of the first FET III of the final stage amplifier 110 and, as previously indicated, due to this L-C resonance, an oscillation of energy can take place between the inductor 611 and the gate to source capacitor of the final stage amplifier 110. Path 620 in FIG. 6 shows the resonant current circulation.

In the exemplary embodiment of FIG. 6, the oscillation of energy between the resonant inductor 611 and the gate to source capacitor of the final stage amplifier 110 may allow the circuit arrangement of the of the multistage amplifier 600 of the exemplary circuital arrangement of FIG. 6 to draw less driving current as well as less power from the battery supply, thus improving the overall power efficiency of the circuit. In the exemplary embodiment of FIG. 6, due to the absence of the DC blocking capacitor in series with gate connection of the first FET 111 of the final stage amplifier 110 as shown in the exemplary embodiment of FIG. 5, the DC bias at the gate of the first FET 111 of the final stage amplifier 110 may be determined by $V_{DD\_PRE}$. This configuration of the multistage amplifier 600, as shown in the exemplary embodiment of FIG. 6, may simplify the amplifier layout in, for example, an integrated circuit, by reducing the number of components and may eliminate RF current losses in the DC blocking capacitor, thus making the driving of the first FET 111 of the final stage amplifier 110 more efficient.

According to an exemplary embodiment of the present disclosure, FIG. 7 shows another exemplary embodiment of a multistage amplifier 700 similar to the multistage amplifier arrangement of FIG. 2 with a P-type MOSFET 701 connected at the output terminal 103 of the pre-driver 100. In the exemplary embodiment of FIG. 7, the output 103 of the pre-driver 100 is connected to the gate terminal of a P-type MOSFET 701. Similar to the previous exemplary embodiment of FIG. 6, the source $V_{DD\_PRE}$ may supply voltage to the FET 701 and it may be connected directly at the source terminal of the FET 701. In the exemplary embodiment of FIG. 7, a decoupling capacitor 711 (having a capacitance $C_7$) may be placed between the source $V_{DD\_PRE}$ and the ground. In the exemplary embodiment of FIG. 7, an inductor 713 (having an inductance $L_6$) may be placed between the drain terminal of the FET 701 and ground. The inductor 713 may be configured to form a parallel LC resonant circuit configuration with the gate to source capacitor of the first FET 111 of the final stage amplifier 110. In the exemplary circuit arrangement of FIG. 7, the resonant current circulation path may be smaller and more localized compared to the exemplary embodiments of FIGS. 5A and 6, which, in turn, may provide the overall circuit with improved efficiency.

In the exemplary embodiment of the multistage amplifier of FIG. 7, the DC bias of the first FET 111 of the final stage amplifier 110 may be decoupled from $V_{DD\_PRE}$, thus setting the DC bias of the first FET ($M_1$) of the final stage amplifier 110 to 0V by means of the resonant inductor 713, which is connected to ground. In some embodiments, similar to the exemplary embodiment of FIG. 7, the first FET 111 of the final stage amplifier 110 may be implemented with intrinsic NMOS device. In such case, the gate driving RF voltage of the first FET ($M_1$) may have a positive and negative swing around the 0V DC bias of the first FET 111 of the final stage amplifier 110. This positive and negative swing around the 0V DC bias of the first FET 111 may drive the first FET 111 more efficiently compared to the exemplary embodiment of FIG. 7. The positive swing may be large enough to turn the FET 111 properly on and the negative swing may be large enough to turn the FET 111 fully off.

According to an exemplary embodiment of the present disclosure, FIG. 8 shows an exemplary circuit arrangement of a multistage amplifier 800 comprising a plurality of two stage amplifiers connected in parallel with each other. In the exemplary embodiment of FIG. 8, each two stage amplifier among the plurality of two stage amplifiers may be configured as the exemplary two stage amplifier arrangement of FIG. 4A (e.g. amplifiers 101 and 110). In the exemplary embodiment of FIG. 8, the plurality of two stage amplifiers may be configured to share a common resonant inductor-capacitor circuit coupled between the plurality of pre-drivers 811 and the plurality of final stage amplifiers 821. The plurality of two stage amplifiers in the circuit arrangement of FIG. 8 is configured to operate simultaneously with one another, amplifying a same input signal fed to the input of each pre-driver 811. In the exemplary multistage amplifier arrangement of FIG. 8, each output from each pre-driver 811 among the plurality of pre drivers may be tied together and connected to a bus 803. Furthermore, each input from each final driver 821 among the plurality of final drivers of the multistage amplifier arrangement 800 may be connected to the bus 803 as well.

In accordance with the present disclosure, in the exemplary embodiment of FIG. 8, the resonant inductor-capacitor circuit may comprise a three terminal resonant inductor 830 (having inductance $L_R$) and two capacitors 801, 802. The resonant inductor 830 may be realized with two ground returns to place the DC blocking capacitors 801, 802 on both sides of the resonant inductor 830, as shown in the exemplary embodiment of FIG. 9A. Such an arrangement of the resonant inductor 830 may provide the circuit arrangement of FIG. 8 with a symmetrical ground current return, or in other terms provide a balanced current flow through the return paths. This arrangement of the return paths in the inductor 830 may provide the L-C resonant arrangement (comprising inductor 830 and capacitors 801, 802) with improved inductance and quality factor. In the exemplary embodiment of FIG. 8, the resonant inductor 830 may be configured to enable the simultaneous operation of the pre-drivers 811 with reduced impact due to the electrical delays in the pre-driver connection path. For cases where the multistage amplifier arrangement 800 comprises large number of pre-drivers 811 and amplifiers 821, it can be beneficial to have a resonant inductor 830 with a larger number (e.g. more than two) of return paths with controlled impedance (e.g. inductance), such as depicted in FIG. 9B. Similar to the embodiment according to FIG. 9A, by virtue of the symmetry in its plurality of return paths, when used in the multistage amplifier arrangement 800, inductor 830 of FIG. 9B can provide a balanced current flow in its plurality of return paths and thus improve overall operation of the arrangement.

A delay in the pre-driver connection path may result in an uneven and not simultaneous operation of the pre-drivers 811 (e.g. different delays in an amplified signal output by pre-drivers) which in turn can impair the PA efficiency. In the exemplary embodiment of FIG. 8, the inductor 830 may be configured to be positioned centrally with respect to the arrangement of the pre-drivers 811 on an integrated circuit. Additionally, the ground return current through the ground return capacitors coupled to the resonant inductor 830 can flow symmetrically (e.g. balanced flow of current) on both sides of the plurality of pre-driver amplifiers 811 layout.

Figure 10B:
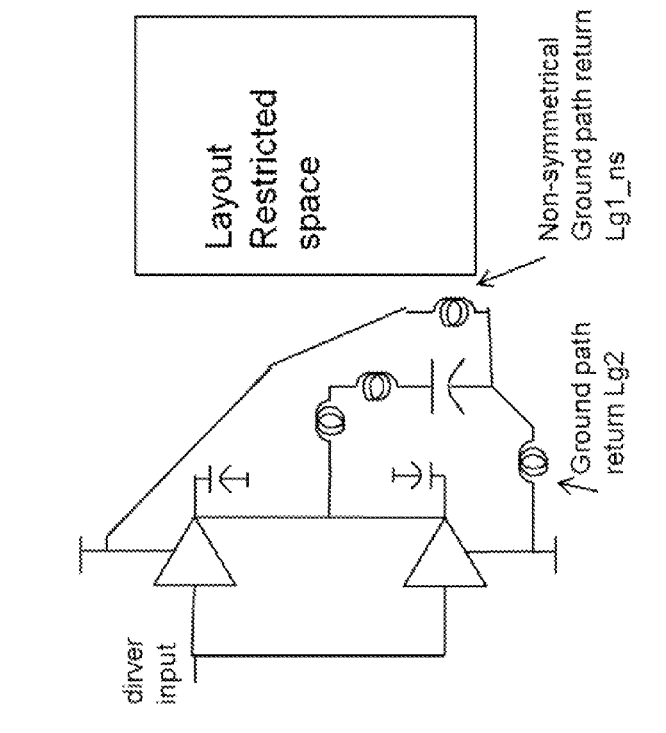
FIGS. 10A and 10B show exemplary physical connections of the parallel pre-drivers and the resonant inductor of FIG. 8 given some layout restricted space.
Figure 10A:
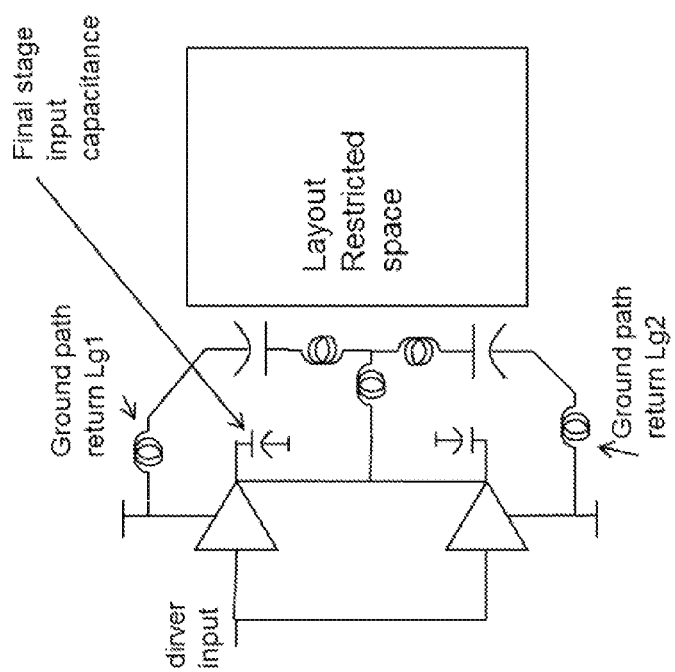

FIGS. 10A and 10B show exemplary physical connections of the pre-drivers 811 output to the inductor 830 and the final, driver 821 given some layout restricted space (e.g. limiting layout space availability). Although FIGS. 10A and 10B depict the case where inductor 830 has two return paths (e.g. per FIG. 9A), based on the presented teachings, the skilled person will know how to expand such teachings for the case where the inductor 830 has more than two return paths (e.g. per FIG. 9B). In both exemplary cases depicted by FIGS. 10A and 10B, the inductor 830 is centrally positioned with respect to the arrangement of pre-drivers 811. In the case depicted by FIG. 10A, the return paths of the current out of the symmetrical outputs of the inductor 830 and through the return capacitors is substantially of a same length and connecting to a reference ground at two opposite pre-drivers 811 (e.g. a first one and a last one) with respect to the central position of the pre-drivers arrangement. Each of the two (or more) return paths can then be modeled by an equivalent inductance of substantially same value, Lg1 and Lg2 (and LgN) respectively, as depicted in FIG. 10A. By virtue of the symmetrical ground return paths and the relative positioning of the various elements of FIG. 10A, the return current through the inductor's two (or more) outputs, the capacitors connected to each inductor output and the return traces (e.g. of inductance Lg1, Lg2, LgN) is substantially same, thus creating a balanced (e.g. symmetrical) current flow through the two inductor outputs. A large contributing factor to the imbalance (e.g. asymmetry) of the current flow in the arrangement depicted by FIG. 10A is the asymmetry in inductance of the resonant inductor for a current flowing through one output versus the other. This asymmetry can be around 5% which in turn can generate a current imbalance (e.g. asymmetry) of same value. For practical purposes, a 5% difference in return current through the two (or more) output paths of the inductor 830 can be considered as a substantially balanced (e.g., symmetrical) output current. This is in contrast to the exemplary case depicted by FIG. 10B, wherein largely asymmetrical return paths out of the two (or more) inductor outputs can create largely different corresponding return currents of up 26%. This difference can be formulated by the difference in return path inductances (e.g. Lg1, Lg2, LgN), which directly affects the asymmetry value (e.g. imbalance) of the two (or more) current flows. For example, if inductance of the resonant inductor is 300 pH, and the difference between Lg1 and Lg2 is 80 pH, then the current imbalance (e.g. asymmetry) can be approximated in a first order to the ratio 80/300=26.6%.

In accordance with the present disclosure, FIGS. 11-14 represent various implementations of the resonant inductor 830 configuration of the exemplary embodiment of FIG. 8. The resonant inductor 830 configurations of FIGS. 11-14 generally comprise a main coil 804 and a return path 805 of the resonant inductor 830. The resonant inductor 830 further comprises an input terminal and two or more output terminals. In the resonant inductor configuration of FIGS. 11-14, the main coil of the resonant inductor 830 is in a spiral configuration and can comprise an outer terminal 1001 and a central terminal 1002. The outer terminal 1001 of the main coil may be located at the outermost point of the spiral and the central terminal 1002 of the main coil may be located at the innermost point of the spiral. The input terminal of the resonant inductor can be coupled to the outer terminal 1001 of the main coil.

Figure 11:
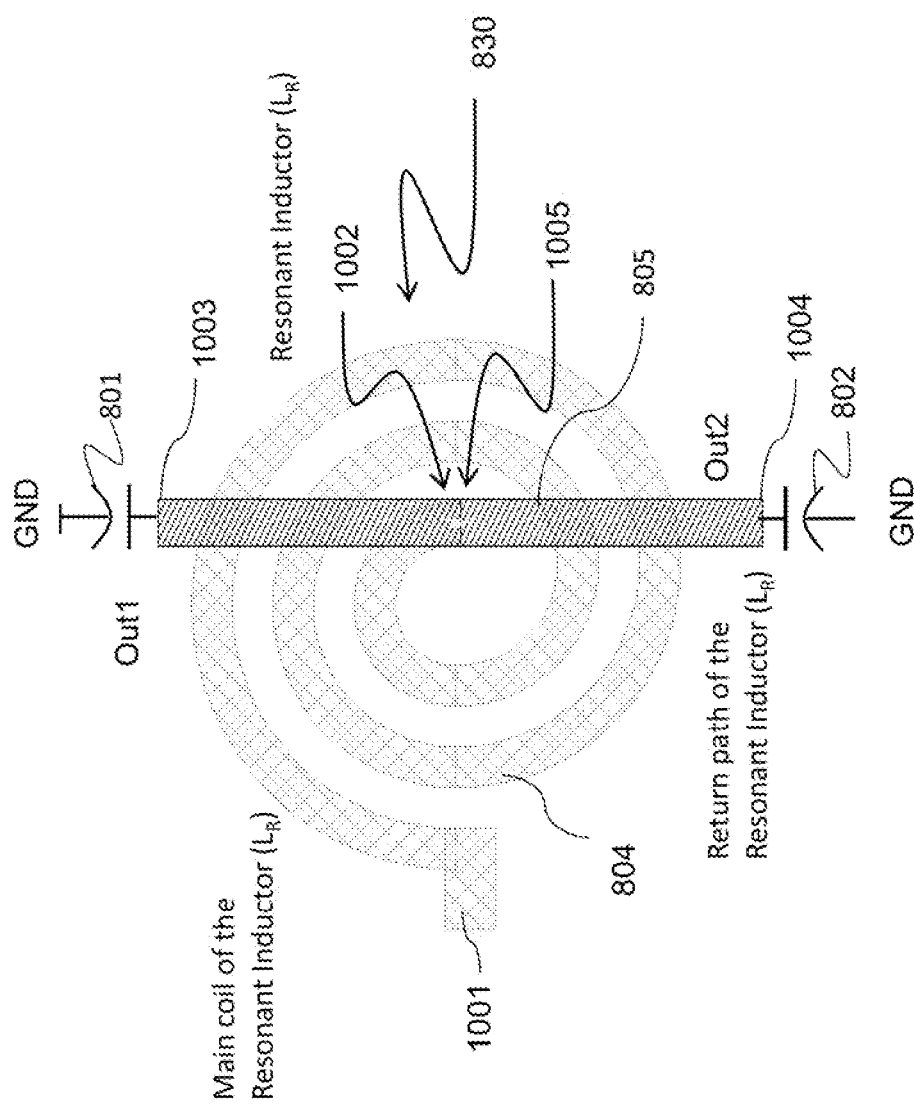
FIGS. 11-14 show different implementations of the resonant inductor ($L_R$) of the exemplary embodiment of FIG. 8.

In the exemplary embodiment of FIG. 11, the return path of the resonant inductor 830 is a straight resistive line with two output terminals 1003, 1004 and a central terminal 1005. In the exemplary embodiments of FIGS. 11-14, the two output terminals of the resonant inductor 830 are coupled to the two output terminals 1003, 1004 of the return paths. The capacitors 801, 802 may be connected at the two output terminals 1003, 1004 of the return path 805 of the resonant inductor 830. In this case, the return path 805 is symmetrically divided at both sides of the central terminal 1005. The main coil 804 and the return path 805 of the resonant inductor 830 may be coupled to each other at their central terminal 1002, 1005.

Although in the embodiment of FIG. 11 the return path 805 is coupled to the central terminal 1002 of the main coil 804, according to some embodiments of the present disclosure, a corresponding dual configuration, wherein the return path is coupled to the outer terminal 1001 of the main coil 804 can be obtained. In such configuration, the input terminal of the resonator inductor 830 is coupled to the central terminal 1002 of the main coil. Such dual configuration can be obtained for all configurations depicted in FIGS. 11-14. Furthermore, the skilled person will know that a clockwise or counter clockwise spiral can give equivalent electrical properties to the various coils as represented in FIGS. 11-14, and such exemplary figures should not be used as limiting the scope of the invention as disclosed herewith.

Figure 12:
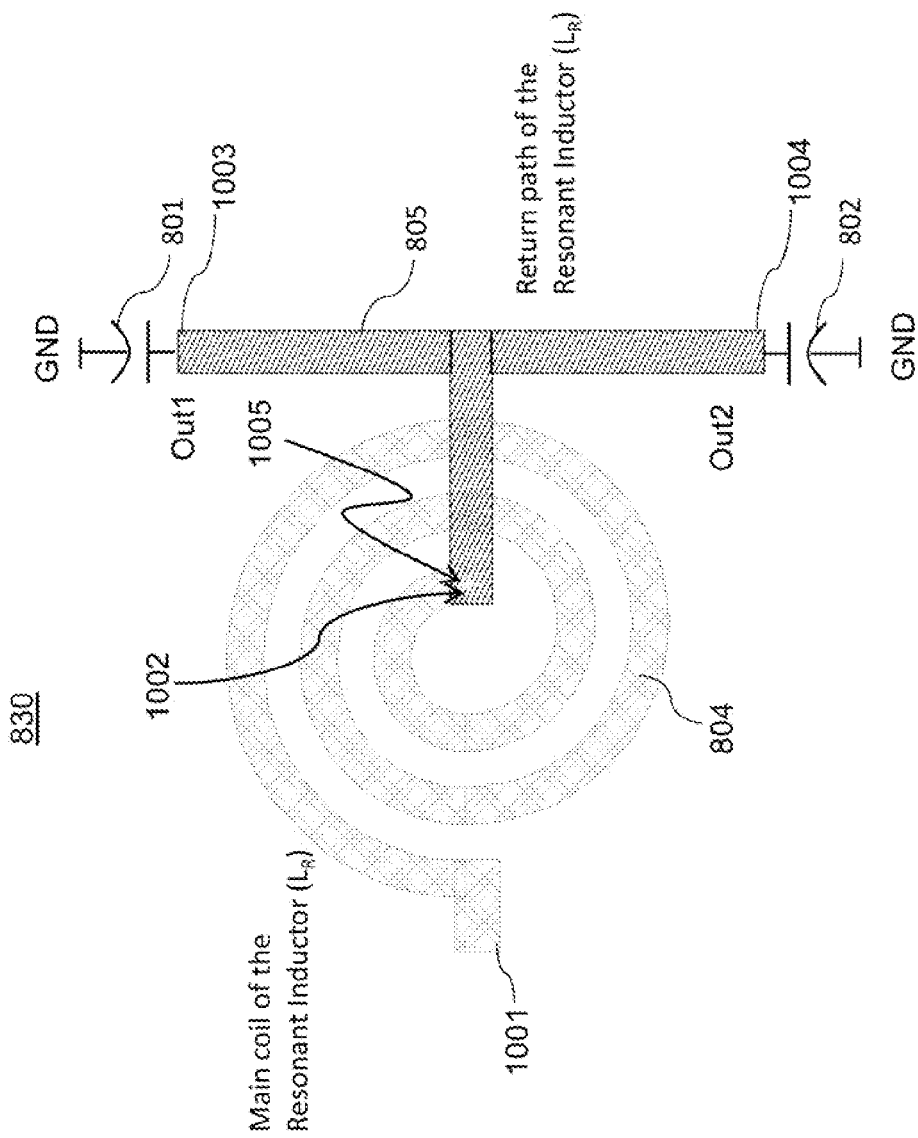

In the exemplary embodiment of FIG. 12, the return path of the resonant inductor 830 is a resistive line configured in a T-configuration comprising a vertical branch and a horizontal branch. In this case, two output terminals 1003, 1004 of the return path may be located at the two ends of the vertical branch and the central terminal 1005 may be located at a first end of the horizontal branch. The second end of the horizontal branch of the return path is coupled to the vertical branch of the conductor path at the center of the vertical branch. Similar to the exemplary embodiment of FIG. 11, the capacitors 801, 802 may be connected at the two output terminals 1003, 1004 of the return path of the resonant inductor 830. In this case, the return path 805 is symmetrical with respect to the horizontal branch of the return path. In this case, the main coil 804 and the return path 805 of the resonant inductor 830 can be coupled to each other at their center terminals 1002, 1005.

The different configurations of the resonant inductor 830 arrangements depicted in FIGS. 11-14 may be preferable over each other depending on various factors. For example, implementation of the resonant inductor ($L_R$) configuration shown in FIG. 12 on an integrated circuit may require more space than is needed for the resonant inductor 830 shown FIG. 11, which may result in a less compact layout. Additionally, in an implementation of the inductor 830 configuration shown in FIG. 12, the inductor 830 may have longer return paths 805 in comparison to the implementation of inductor 830 as shown in FIG. 11. The longer return paths of the inductor 830 implementation shown in FIG. 12 may result in a lower Q factor for the inductor 830.

Figure 13A:
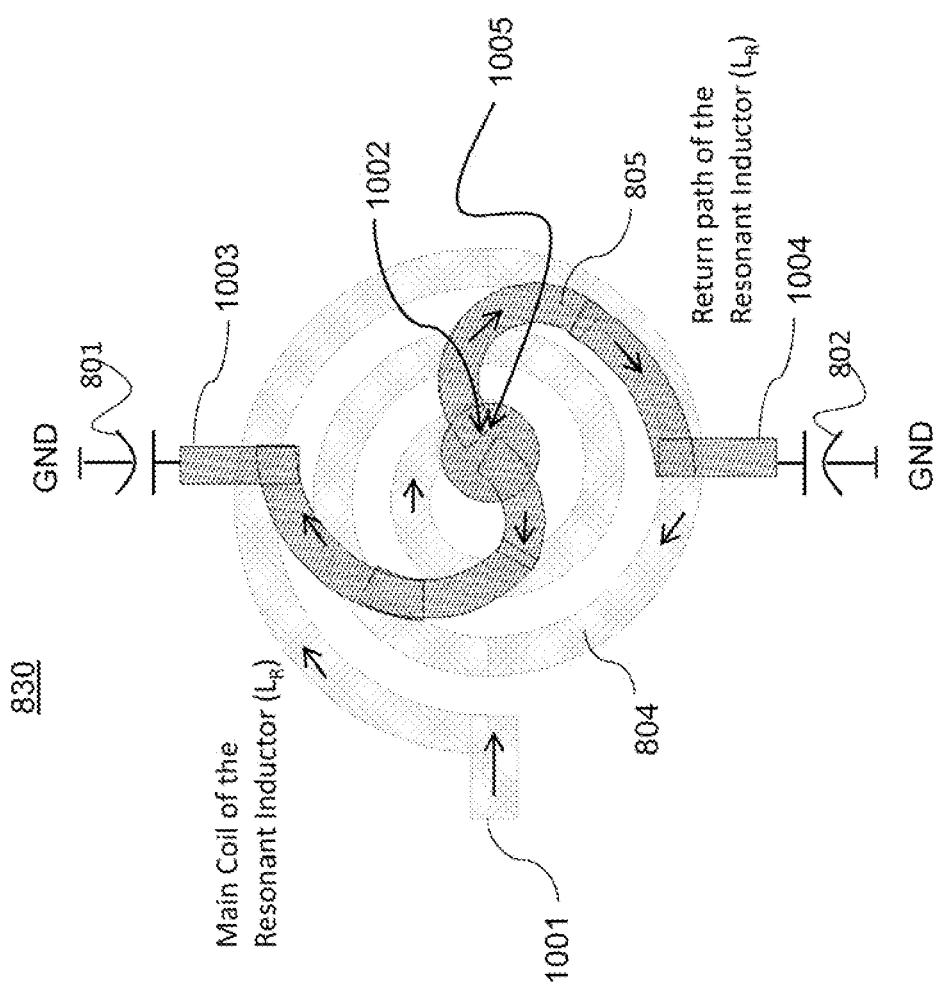
Figure 13B:
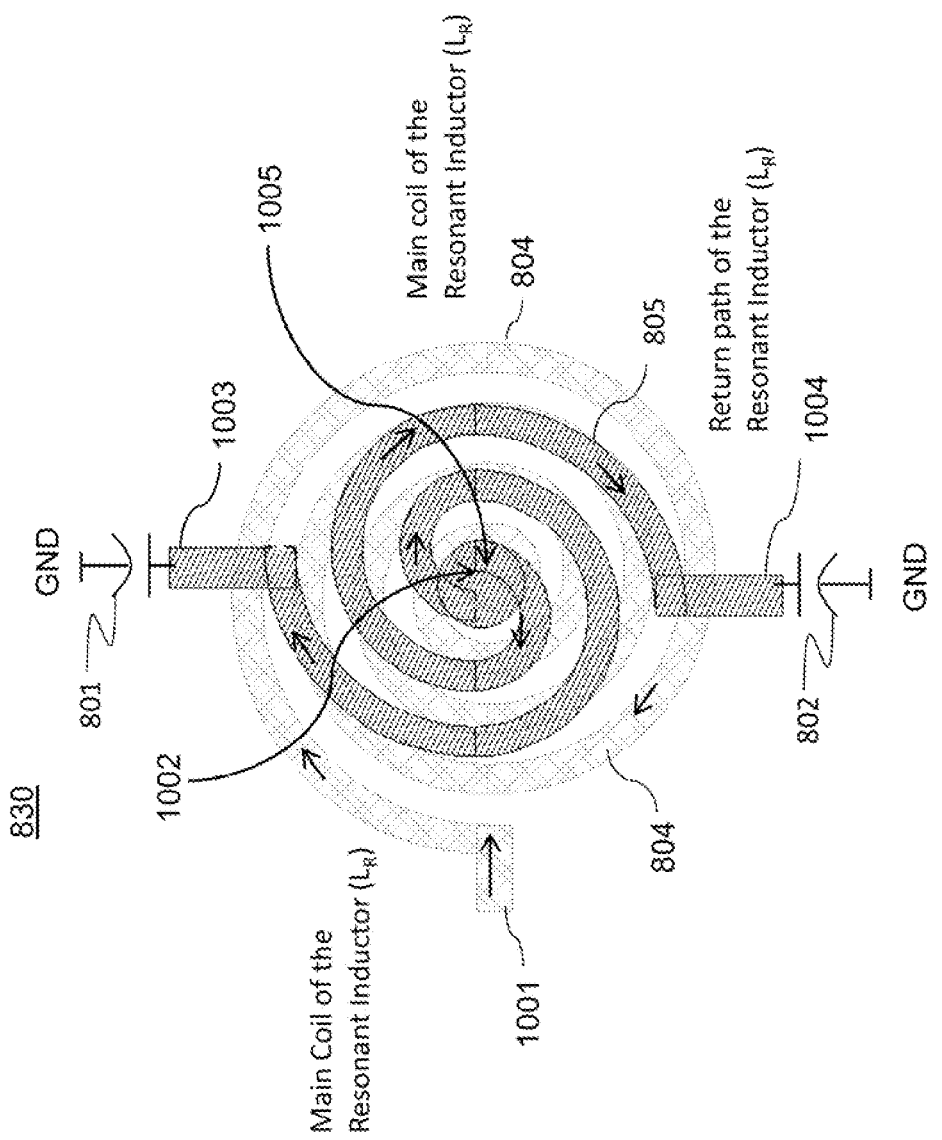
Figure 13C:
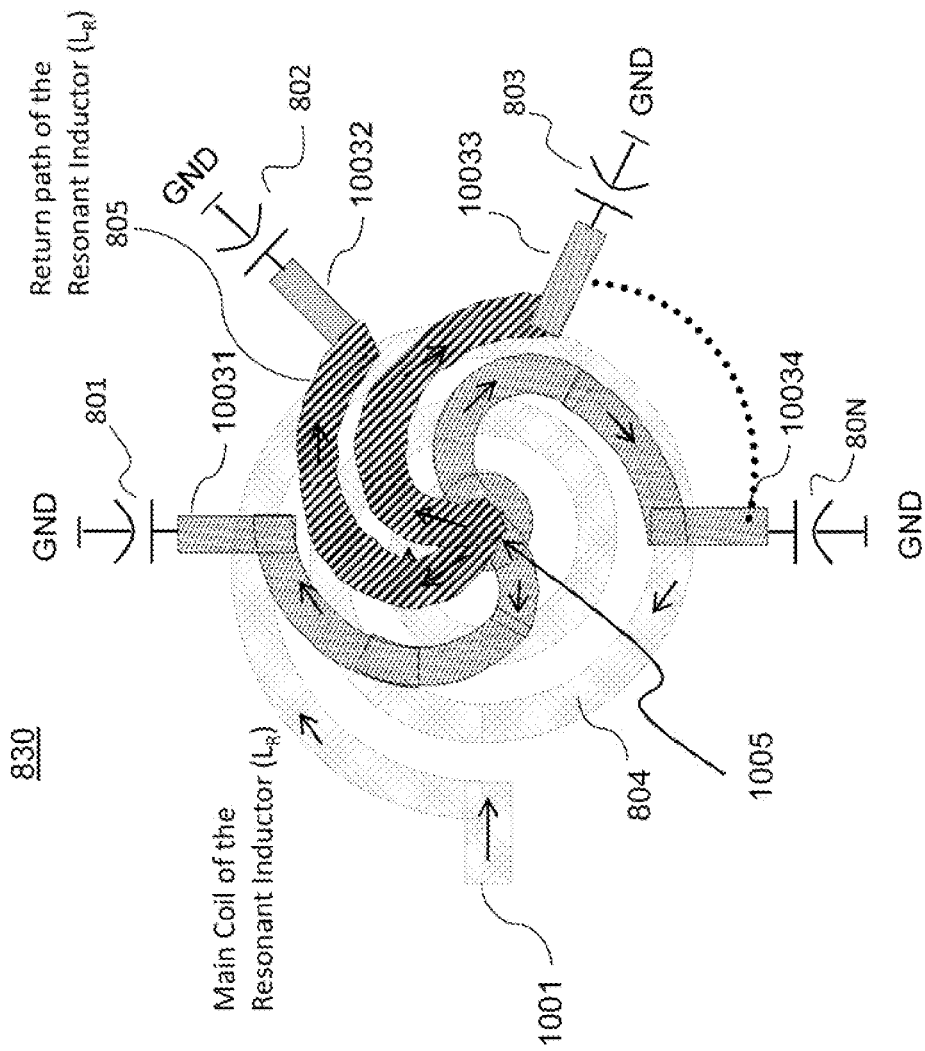

According to an exemplary embodiment of the present disclosure, FIGS. 13A and 13B show exemplary implementations of the resonant inductor 830 configuration of FIG. 8 and FIG. 9A. In the exemplary implementations of the resonant inductor 830 shown in FIGS. 13A and 13B, the return path 805 of the resonant inductor 830 may be configured in a spiral configuration similar to the main coil 804 of the resonant inductor 830, and may, therefore, require less layout space than the configurations shown in FIGS. 11 and 12. In this case, the return path may comprise two output terminals 1003, 1004 and a central terminal 1005. The capacitors 801, 802 may be connected at the two output terminals 1003, 1004 of the return path 805 of the resonant inductor 830. In the exemplary embodiments of FIGS. 13A and 13B, since the return paths are spiral, so they may show inductor-like properties. The return path 805 of the resonant inductor 830 of FIG. 13B may be configured to have more turns than the return path 805 of the resonant inductor 830 of FIG. 13A. For example, FIG. 13B shows a return path 805 having two segments or traces that curve through at least 270 degrees of rotation. Therefore, in the exemplary configurations of FIGS. 13A and 13B, return paths 805 may serve both as symmetrical connections and continuations of coil windings that increase the total inductance of the coil and Q factor. In this case, both the returns 805 may continue carrying current in the same winding direction as the main coil 804, thus increasing the total inductance. In the exemplary embodiments of FIGS. 13A and 13B, the flow of current is shown by arrows. Finally, FIG. 13C shows an exemplary implementation of the resonant inductor 830 of FIG. 8 and FIG. 9B, wherein more than two (inductive) return paths are provided by the resonant inductor. The implementation depicted by FIG. 13C is an extension of the two return paths implementation depicted by FIG. 13A, with N spiral-shaped return paths (e.g. 10031, 10032, . . . , 1003N), each providing inductor-like properties (e.g. of a same value by virtue of the symmetrical layout of the spiral). Similar extension to multiple return paths can be made for the exemplary implementation depicted by FIG. 13B. Such extensions to multiple return paths have all the advantages provided by the two return paths implementations, with added benefits for the case where the resonant inductor 830 is used to drive larger structures comprising larger number of pre-drivers 811 and amplifiers 821.

Figure 14:
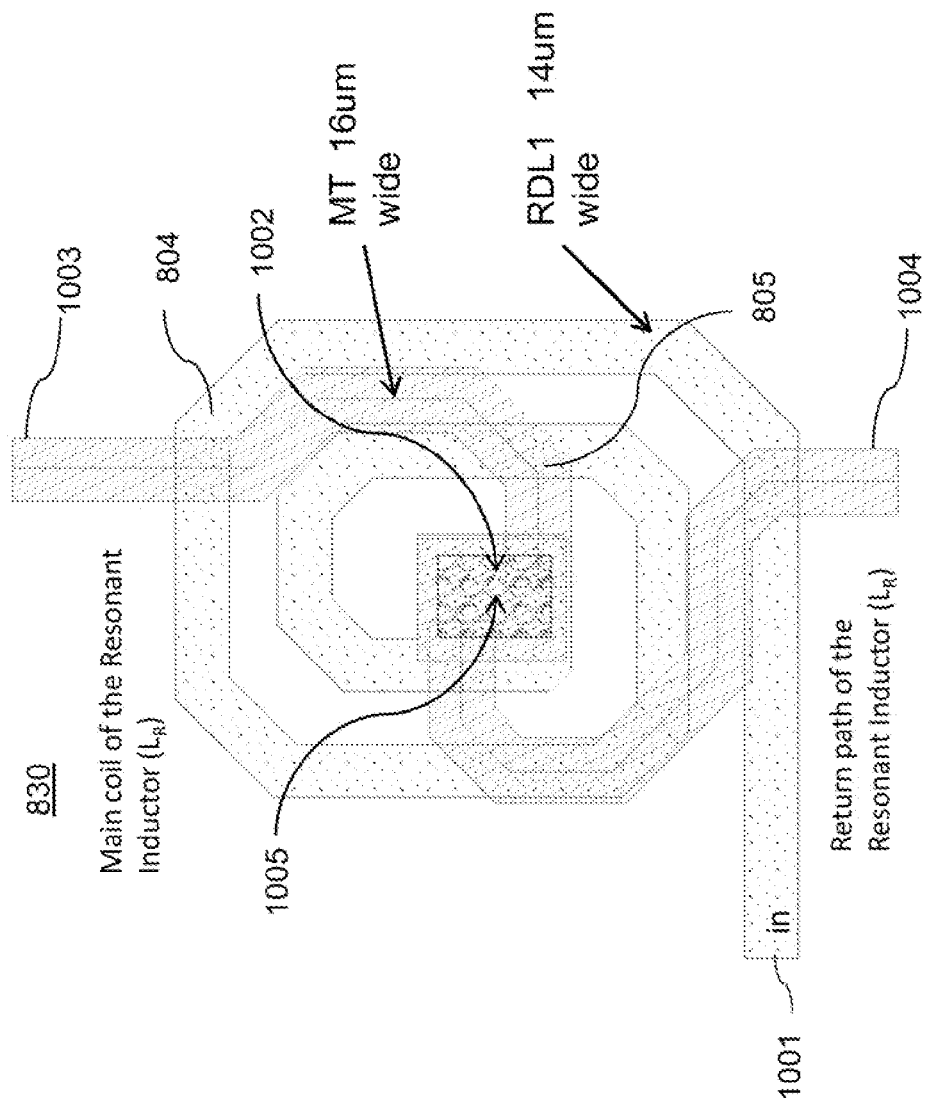

According to an exemplary embodiment of the present disclosure, FIG. 14 shows an exemplary implementation of the resonant inductor 830 of FIG. 8 where the resonant inductor is fabricated on a substrate, such as for use in an integrated circuit. The exemplary implementations of the resonant inductor ($L_R$) as shown in FIG. 14 may be realized by fabricating the return paths 805 with a 16 μm wide and 3 μm thick Aluminum metal layer. Additionally in the exemplary configuration of FIG. 14, a 14 μm wide and 8 μm thick Copper layer may be realized as a post process redistribution layer. Therefore, in such a case, the inductor 830 may enable a symmetrical ground current return (e.g. substantially symmetrical as per prior section of the present disclosure). In the arrangement of the exemplary embodiment of FIG. 14, the return path 805 in the inductor 830 may contribute to the increase of the inductance and the Q factor.

FIGS. 11-14 show spiral or spiral-like inductor configurations. Those skilled in the art understand that such inductor configurations may be characterized by conductive traces arranged in a shape of a line starting at a point, and curving with a regularly increasing radius, to form a series of concentric turns (e.g. a spiral). The concentric turns may be achieved in smoothly curving line or may be achieved as a series of straight line segments, where each segment may be arranged at an angle to each preceding and succeeding segment. Those skilled in the art also understand that the size, shape, and number of turns may be modified to achieve the desired inductance. Those skilled in the art further understand that other inductor configurations may also be used to achieve the inductance components described herein, so the inductance components discussed herein may not be limited to spiral or spiral-like inductor configurations.

According to further embodiments of the present disclosure, the return path 805 of the resonant inductor 830 may comprise more than two output terminals (e.g. FIGS. 9B and 13C), such as for example an even or odd number of output terminals, created by symmetrical traces around the central terminal 1005 (e.g. central terminal 1005 of FIGS. 11-14), latter central terminal making electrical contact to one of the outer terminal 1001 or the central terminal 1002 of the main coil 804. Such symmetrical return paths can have the same benefits as described with respect to the embodiments shown in FIGS. 11-13B and FIG. 14, with added capability for higher power dissipation through the increased number of traces and better filtering of noise and spikes in the return current via the added number of capacitors at the terminals of the return path 805.

A person skilled in the art understands that the resonant inductor 830 described in the exemplary embodiments of FIGS. 8-14, can be used in other circuit arrangements as well.

In accordance with the present disclosure, the exemplary embodiments of the present disclosure may be fabricated in their entirety or partially in an integrated circuit using silicon-on-sapphire (SOS) or silicon on insulator (SOI) technologies.

The examples set forth above are provided to give those of ordinary skill in the art a complete disclosure and description of how to make and use the embodiments of the present disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A switching amplifier comprising:
   a pre-driver amplifier having a pre-driver output;
   a final stage amplifier having a final stage amplifier input and a final stage amplifier output, wherein the final stage amplifier input is coupled to the pre-driver output, and wherein the final stage amplifier input has a final stage amplifier input capacitance, wherein the final stage amplifier is configured to have a charging cycle and a discharging cycle whereby the final stage amplifier input capacitance stores energy during the charging cycle and the final stage amplifier input capacitance discharges energy during the discharging cycle, and
   a resonant circuit element coupled to the final stage amplifier input, wherein the resonant circuit element is configured to receive energy from the final stage amplifier input capacitance during the discharging cycle and supply energy to the final stage amplifier input capacitance during the charging cycle, a capacitance value of the final stage amplifier input capacitance during the discharging cycle being different from a capacitance value of the final stage amplifier input capacitance during the charging cycle,
   wherein the final stage amplifier comprises two subsets of transistors coupled in series with each other, wherein:
      a first subset of transistors comprises a first transistor has a first port coupled to the final stage amplifier input and a second port coupled to a second subset of transistors, and
      the second subset of transistors is coupled between the first subset of transistors and the final stage amplifier output, wherein the second subset of transistors comprises one or more transistors connected in series with each other.

2. The switching amplifier according to claim 1, wherein the switching amplifier has an operating frequency and wherein component values for the resonant circuit element are chosen to provide a resonant frequency of the resonant circuit element and the final stage amplifier input capacitance close to the operating frequency.

3. The switching amplifier according to claim 2, wherein a value of a capacitive reactance of the final stage amplifier input capacitance during the charging cycle is used to select a value of an inductive reactance of the resonant circuit element.

4. The switching amplifier according to claim 3, wherein the input capacitance during the charging cycle varies and wherein a higher value of the input capacitance during the charging cycle is used to select the value of the inductive reactance of the resonant circuit element.

5. The switching amplifier according to claim 1, wherein the final stage amplifier input capacitance comprises a capacitance between the final stage amplifier input and a reference potential and the resonant circuit element comprises an inductive element and a capacitive element connected in series, wherein the resonant circuit element is connected between the final stage amplifier input and the reference potential.

6. The switching amplifier according to claim 2, wherein the resonant circuit element comprises adjustable elements configured to adjust the resonant frequency closer to the operating frequency.

7. The switching amplifier according to claim 6, wherein an adjustable element of the resonant circuit element comprises a digitally tunable inductor (DTL).

8. The switching amplifier according to claim 6, wherein an adjustable element of the resonant circuit element comprises a digitally tunable capacitor (DTC).

9. The switching amplifier of claim 5, wherein the pre-driver comprises:
   a first transistor having a first transistor input, a first transistor second port, and a first transistor third port, and
   a second transistor having a second transistor input, a second transistor second port, and a second transistor third port,
   wherein the first transistor input and the second transistor input are coupled together,
   a first voltage source is connected at the first transistor second port to supply voltage to the pre-driver, the first transistor third port and the second transistor second port are coupled together, and the second transistor third port is connected to the reference potential, and wherein the first transistor third port and second transistor second port are coupled to the pre-driver output.

10. The switching amplifier of claim 1, wherein the final stage amplifier input capacitance comprises a capacitance between the final stage amplifier input and a reference potential and the pre-driver output is coupled to the final stage amplifier input with a bias resistor and the resonant circuit element comprises:
   a transistor having a transistor input, a transistor second port, and a transistor third port, wherein the transistor input is coupled to the pre-driver output and the transistor third port is coupled to the reference potential;
   an inductive element;
   a voltage source coupled to the transistor second port with the inductive element; and
   a capacitive element coupling the transistor second port to the final stage amplifier input.

11. The switching amplifier according to claim 1, wherein final stage amplifier input capacitance comprises a capacitance between the final stage amplifier input and a reference potential and the resonant circuit element comprises:

a transistor having a transistor input, a transistor second port, and a transistor third port, wherein the transistor input is coupled to the pre-driver output and the transistor third port is coupled to the reference potential;

an inductive element;

a voltage source coupled to the transistor second port with the inductive element, wherein the transistor second port is coupled to the final stage amplifier input.

12. The switching amplifier according to claim 1, wherein the final stage amplifier input capacitance comprises a capacitance between the final stage amplifier input and a reference potential and the resonant circuit element comprises:

a transistor having a transistor input, a transistor second port, and a transistor third port, wherein the transistor input is coupled to the pre-driver output;

a voltage source coupled to the transistor second port; and an inductive element coupling the transistor third port to the reference potential, and wherein the transistor third port is coupled to the final stage amplifier input.

13. The switching amplifier according to claim 1, wherein the pre-driver amplifier comprises a plurality of pre-driver amplifier circuits, wherein each pre-driver amplifier circuit has a pre-driver amplifier circuit output and each pre-driver amplifier circuit output is coupled to every other pre-driver amplifier circuit output to provide the pre-driver output and wherein the final stage amplifier comprises a plurality of final stage amplifier circuits, wherein each final stage amplifier circuit has a final stage amplifier circuit input and each final stage amplifier circuit input is coupled to every other final stage amplifier circuit input to provide the final stage amplifier input.

14. The switching amplifier according to claim 1, wherein the resonant circuit element comprises:

an inductor having an inductor input and an inductor output, and a plurality of capacitors each coupled to the inductor output via a corresponding inductor output path of a plurality of inductor output paths and a capacitor first terminal.

15. The switching amplifier according to claim 14, wherein the plurality of inductor output paths are configured to provide a substantially balanced flow of current through the plurality of capacitors.

16. The switching amplifier according to claim 15, wherein the plurality of capacitors comprises three or more capacitors.

17. The switching amplifier according to claim 15, wherein the substantially balanced flow of current comprises a difference of the flow of current through the plurality of capacitors no larger than 5%.

18. The switching amplifier according to claim 14, wherein each of the plurality of inductor output paths is configured to provide a continuation of a coil windings of the inductor, such as to provide an additional inductance to an inductance provided by the inductor.

19. The switching amplifier according to claim 14, further comprising a plurality of ground return paths each coupled to a corresponding capacitor of the plurality of capacitors second terminal, wherein each ground return path of the plurality of ground return paths provide a return path to a current through the corresponding capacitor, and wherein an inductance value of a first ground return path of the plurality of ground return paths is the same as an inductance value of a second ground return path of the plurality of ground return paths.

20. The switching amplifier according to claim 19, wherein the plurality of inductor output paths and the plurality of ground return paths are configured to provide a substantially balanced flow of current through the plurality of capacitors.

21. The switching amplifier according to claim 15, wherein the inductor comprises a spiral inductor comprising a first conductive trace starting at a first point, wherein the first conductive trace forms a series of concentric turns with increasing radius ending at a second point.

22. The switching amplifier according to claim 21, wherein one point of the first point and the second point is coupled to the inductor input and the other point of the first point and the second point is coupled to the inductor output and a first inductor output path of the plurality of inductor output paths comprises a straight second conductive trace and a second inductor output path of the plurality of inductor output paths comprises a straight third conductive trace and wherein the straight second conductive trace and straight third conductive trace are in electrical contact to the first conductive trace only at the inductor output.

23. The switching amplifier according to claim 21, wherein one point of the first point and the second point is coupled to the inductor input and the other point of the first point and the second point is coupled to the inductor output and a first inductor output path of the plurality of inductor output paths and a second inductor output path of the plurality of inductor output paths comprises a second conductive trace structure, wherein the second conductive trace structure has a T-configuration having a vertical branch and a horizontal branch, and wherein a first end of the horizontal branch is coupled to the inductor output and a second end of the horizontal branch is coupled to a central point of the vertical branch, wherein the second conductive trace structure is in electrical contact to the first conductive trace only at the inductor output, and wherein a first end of the vertical branch is coupled to a first capacitor of the plurality of capacitors and a second end of the vertical branch is coupled to a second capacitor of the plurality of capacitors.

24. The switching amplifier according to claim 21, wherein one point of the first point and the second point is coupled to the inductor input and the other point is coupled to the inductor output and wherein a first inductor output path of the plurality of inductor output paths comprises a second conductive trace having a spiral path from the inductor output to a first capacitor of the plurality of capacitors and wherein a second inductor output path of the plurality of inductor output paths comprises a third conductive trace having a spiral path from the inductor output to a second capacitor of the plurality of capacitors, and wherein the first conductive trace and third conductive trace are electrically coupled to the first conductive trace at the inductor output.

25. The switching amplifier according to claim 21, wherein one point of the first point and the second point is coupled to the inductor input and the other point is coupled to the inductor output and wherein each inductor output path of the plurality of inductor output paths comprises a corresponding conductive trace of a plurality of conductive traces having a spiral path from the inductor output to a corresponding capacitor of the plurality of capacitors, and wherein the plurality of conductive traces are electrically coupled to the first conductive trace at the inductor output.

26. The switching amplifier according to claim 25, wherein each inductor output path of the plurality of inductor output paths is configured to provide a continuation of a coil windings of the inductor such as provide an additional inductance to an inductance provided by the inductor.

27. The switching amplifier according to claim 25, wherein the plurality of inductor output paths are configured to provide a substantially balanced flow of current through the plurality of capacitors.

28. The switching amplifier according to claim 27, wherein the substantially balanced flow of current comprises a difference of the flow of current through the plurality of capacitors no larger than 5%.

29. The switching amplifier according to claim 25, wherein each conductive trace of the plurality of conductive traces has a path that curves at least 270 degrees and the plurality of conductive traces are in electrical contact only at the inductor output.

30. The switching amplifier according to claim 1, wherein the switching amplifier is fabricated on an integrated circuit using silicon on sapphire (SOS) or silicon on insulator technology (SOI).

31. The switching amplifier according to claim 1, wherein the final stage amplifier comprises one or more Field Effect Transistors.

32. A method for amplifying an input signal to an output signal with switching amplification, wherein the method comprises:
    amplifying the input signal with a pre-driver amplification stage to provide a pre-driver output signal;
    coupling the pre-driver output signal to a final amplification stage input of a final amplification stage, wherein the final amplification stage input has a charging cycle and a discharging cycle and wherein the final amplification stage input has a final amplification input capacitance configured to have a different capacitance value between the discharging cycle and the charging cycle;
    discharging at least a portion of energy stored in the final amplification input capacitance into a resonant element during the discharging cycle;
    charging the final amplification input capacitance with at least a portion of energy stored in the resonant element during the charging cycle; and
    amplifying the final amplification stage input to the output signal with the final amplification stage,
    wherein the final amplification stage comprises two subsets of transistors coupled in series with each other; wherein:
        a first subset of transistors comprises a first transistor has a first port coupled to the final amplification stage input and a second port coupled to a second subset of transistors, and
        the second subset of transistors is coupled between the first subset of transistors and a final stage amplifier output, wherein the second subset of transistors comprises one or more transistors connected in series with each other.

33. The method according to claim 32, wherein the final amplification stage is configured as a Class C, D, E, or F amplifier.

34. The method according to claim 32, wherein the resonant element comprises an inductor and a capacitor configured in a series configuration and coupled between the final amplification stage input and reference potential.

35. The method according to claim 32, wherein the pre-driver amplification stage comprises a pair of stacked transistors, wherein the stacked transistors are configured to receive the input signal and to produce the pre-driver output signal.

36. The method according to claim 32, wherein the resonant element is coupled between the final amplification stage input and reference potential and the resonant element comprises: an inductor and a capacitor configured in a series configuration.

37. The method according to claim 32, wherein coupling the pre-driver output signal to the final amplification stage input comprises:
    coupling the pre-driver signal to the final amplification stage input with a bias resistor, and
    applying the pre-driver signal to an input of a transistor and coupling an output of the transistor to the final amplification stage input with a DC block capacitor, and,
    wherein the resonant element comprises an inductor coupled to a voltage source.

38. The method according to claim 32, wherein coupling the pre-driver output signal to the final amplification stage input comprises applying the pre-driver to an input of a transistor and coupling an output of the transistor to the final amplification stage input, and wherein the resonant element comprises an inductor coupled to a voltage source.

39. The method according to claim 32, wherein coupling the pre-driver output signal to the final amplification stage input comprises applying the pre-driver to an input of a transistor and coupling an output of the transistor to the final amplification stage input, and wherein the resonant element comprises an inductor coupled to reference potential.

40. The method according to claim 32, wherein the pre-driver amplification stage comprises a plurality of pre-drivers and the final amplification stage comprises a plurality of final stage amplifiers and wherein coupling the pre-driver output signal to the final amplification stage input comprises:
    coupling each output of each pre-driver to a bus, and
    coupling the bus to an input of each final stage amplifier, and wherein the resonant element comprises an inductor with an inductor input and two inductor outputs, wherein the inductor input is coupled to the bus and each inductor output is coupled to a capacitor.

41. The method according to claim 40, wherein the inductor comprises a spiral inductor.

42. A multistage amplifier arrangement comprising:
    means for pre-driver amplification;
    means for final stage amplification, wherein an input of the means for final stage amplification is coupled to an output of the means for pre-driver amplification and wherein the input of the means for final stage amplification comprises a means for capacitive energy storage; and
    means for energy storage, wherein the means for energy storage is coupled to the output of the means for pre-driver amplification and is configured to receive/provide energy from/to the means for capacitive energy storage,
    wherein the means for final stage amplification comprises two subsets of transistors coupled in series with each other, wherein:
        a first subset of transistors comprises a first transistor has a first port coupled to the input of the means for final stage amplification and a second port coupled to a second subset of transistors, and
        the second subset of transistors is coupled between the first subset of transistors and an output of the means for final stage amplification, wherein the second subset of transistors comprises one or more transistors connected in series with each other.

43. The multistage amplifier arrangement according to claim 42, wherein the first subset of transistors and the second subset of transistors comprise field effect transistors, bipolar junction transistors, or a combination of field effect transistors and bipolar junction transistors.

44. The multistage amplifier arrangement according to claim 42, wherein the means for energy storage comprises means for inductive energy storage configured in series with a second means for capacitive energy storage.

45. The multistage amplifier arrangement according to claim 44, wherein the means for inductive energy storage and/or capacitive energy storage comprise a digitally tunable inductor and/or a digitally tunable capacitor.

46. The multistage amplifier arrangement according to claim 42, wherein the means for pre-driver amplification comprises one or more transistors, wherein the one or more transistors comprise field effect transistors, bipolar junction transistors, or a combination of field effect transistors and bipolar junction transistors.

47. The multistage amplifier arrangement according to claim 42, wherein the means for energy storage comprises:
   means for inductive storage, wherein the means for inductive storage has an input coupled to the output of the means for pre-driver amplification;
   a second means for capacitive energy storage, wherein the second means for capacitive energy storage is coupled to a first output of the means for inductive storage; and
   a third means for capacitive energy storage, wherein the third means for capacitive energy storage is coupled to a second output of the means for inductive storage.

48. The multistage amplifier arrangement according to claim 47, wherein the means for inductive storage comprises an inductor having a main coil coupled to the inductive storage input at one end of the main coil and a return path coupled to another end of the main coil, and wherein the return path couples the first output and second output of the means for inductive storage to the other end of the main coil.

49. The multistage amplifier arrangement according to claim 48, wherein the main coil comprises a first spiral metal trace fabricated on a substrate and the return path comprises a second metal trace fabricated on the substrate.

50. The multistage amplifier arrangement according to claim 49, wherein the first spiral metal trace comprises copper and the second metal trace comprises aluminum.

51. A switching amplifier comprising:
   a pre-driver amplifier having a pre-driver output;
   a final stage amplifier having a final stage amplifier input and a final stage amplifier output, wherein the final stage amplifier input is coupled to the pre-driver output, and wherein the final stage amplifier input has a final stage amplifier input capacitance, wherein the final stage amplifier is configured to have a charging cycle and a discharging cycle whereby the final stage amplifier input capacitance stores energy during the charging cycle and the final stage amplifier input capacitance discharges energy during the discharging cycle, and
   a resonant circuit element coupled to the final stage amplifier input, wherein the resonant circuit element is configured to receive energy from the final stage amplifier input capacitance during the discharging cycle and supply energy to the final stage amplifier input capacitance during the charging cycle, a capacitance value of the final stage amplifier input capacitance during the discharging cycle being different from a capacitance value of the final stage amplifier input capacitance during the charging cycle,
   wherein:
   the switching amplifier has an operating frequency and wherein component values for the resonant circuit element are chosen to provide a resonant frequency of the resonant circuit element and the final stage amplifier input capacitance close to the operating frequency, and
   the resonant circuit element comprises adjustable elements configured to adjust the resonant frequency closer to the operating frequency.

52. The switching amplifier according to claim 51, wherein an adjustable element of the resonant circuit element comprises a digitally tunable inductor (DTL).

53. The switching amplifier according to claim 51, wherein an adjustable element of the resonant circuit element comprises a digitally tunable capacitor (DTC).

54. A switching amplifier comprising:
   a pre-driver amplifier having a pre-driver output;
   a final stage amplifier having a final stage amplifier input and a final stage amplifier output, wherein the final stage amplifier input is coupled to the pre-driver output, and wherein the final stage amplifier input has a final stage amplifier input capacitance, wherein the final stage amplifier is configured to have a charging cycle and a discharging cycle whereby the final stage amplifier input capacitance stores energy during the charging cycle and the final stage amplifier input capacitance discharges energy during the discharging cycle, and
   a resonant circuit element coupled to the final stage amplifier input, wherein the resonant circuit element is configured to receive energy from the final stage amplifier input capacitance during the discharging cycle and supply energy to the final stage amplifier input capacitance during the charging cycle, a capacitance value of the final stage amplifier input capacitance during the discharging cycle being different from a capacitance value of the final stage amplifier input capacitance during the charging cycle,
   wherein:
   the final stage amplifier input capacitance comprises a capacitance between the final stage amplifier input and a reference potential and the resonant circuit element comprises an inductive element and a capacitive element connected in series, wherein the resonant circuit element is connected between the final stage amplifier input and the reference potential, and
   the pre-driver comprises:
      a first transistor having a first transistor input, a first transistor second port, and a first transistor third port, and
      a second transistor having a second transistor input, a second transistor second port, and a second transistor third port,
      wherein the first transistor input and the second transistor input are coupled together, a first voltage source is connected at the first transistor second port to supply voltage to the pre-driver, the first transistor third port and the second transistor second port are coupled together, and the second transistor third port is connected to the reference potential, and wherein the first transistor third port and second transistor second port are coupled to the pre-driver output.

* * * * *